(12) United States Patent
Tachikawa

(10) Patent No.: US 7,732,843 B2
(45) Date of Patent: Jun. 8, 2010

(54) SOLID STATE IMAGE SENSOR

(75) Inventor: Keishi Tachikawa, Osaka (JP)

(73) Assignee: Panasonic Corporation, Osaka (JP)

( * ) Notice: Subject to any disclaimer, the term of this patent is extended or adjusted under 35 U.S.C. 154(b) by 10 days.

(21) Appl. No.: 12/185,314

(22) Filed: Aug. 4, 2008

(65) Prior Publication Data

US 2009/0039395 A1    Feb. 12, 2009

(30) Foreign Application Priority Data

Aug. 6, 2007    (JP) .............................. 2007-203722

(51) Int. Cl.
    *H01L 31/062* (2006.01)
(52) U.S. Cl. ........................ 257/291; 257/225; 257/226; 257/242; 257/258; 257/292; 257/E27.15
(58) Field of Classification Search ................. 257/225, 257/226, 242, 258, 291, 292, E27.15
    See application file for complete search history.

(56) References Cited

U.S. PATENT DOCUMENTS

| 6,426,238 B1 | 7/2002 | Morimoto ..................... 438/52 |
| 6,833,870 B1 | 12/2004 | Nishi ......................... 348/294 |
| 7,244,971 B2 | 7/2007 | Sakamoto et al. ........... 257/184 |

*Primary Examiner*—Tan N Tran
(74) *Attorney, Agent, or Firm*—Steptoe & Johnson LLP

(57) ABSTRACT

Forming an impurity region 6 and an impurity region 5 having a lower concentration than the impurity region 6 in a lower layer region of a gate electrode close to the boundary with a signal electron-voltage conversion section of a horizontal CCD outlet makes it possible to smooth a potential distribution at the time of transfer, improve the transfer efficiency, increase the number of saturated electrons and reduce variations in the transfer efficiency and variations in saturation.

5 Claims, 19 Drawing Sheets

SOLID STATE IMAGE SENSOR

FIELD OF THE INVENTION

The present invention relates to a solid state image sensor made up of a horizontal transfer CCD section that receives signal electrons and transfers the signal electrons in a horizontal direction, an electron-voltage conversion section that converts the electrons transferred from the horizontal CCD section to a signal voltage and a reset drain section that discharges the electrons.

BACKGROUND OF THE INVENTION

With the miniaturization of cameras and increasing pixel counts, significant advances are being observed in cell miniaturization of downsizing pixel cells while increasing the number of electrons handled per unit area in CCD solid state image sensing elements used for HD video cameras and digital still cameras in classes over 10 million pixels for consumer and business applications. In addition, imaging with moving pictures is an indispensable function for these CCDs and this is required to be achieved concurrently with the speed-up of horizontal CCD drive.

Since the transfer length of a repetition section of a horizontal CCD is shortened as cells become finer, transfer deterioration is less likely to be a problem. The number of saturated electrons in the repetition section can also be secured by only widening the repetition section, and is thus unlikely to be a problem either. However, the horizontal CCD outlet that makes a connection from the repetition section of the horizontal CCD to a floating diffusion (FD) section that performs signal electron-voltage conversion is shaped such that the horizontal CCD of the repetition section is gradually narrowed down to collect signal electrons from the repetition section of the horizontal CCD having a large design size to the FD section having a small design size. Therefore, the gate length of the outlet and the width of the CCD cannot be reduced and the number of saturated electrons at the horizontal CCD outlet cannot be maintained, and it is therefore difficult to improve transfers at the outlet for the purpose of increasing the speed of horizontal CCD drive.

Furthermore, in order to downsize pixel cells, which requires an increase of the number of electrons handled per unit area, it is effective to make n- and p-type diffusion layers forming a CCD channel shallower and have a higher concentration.

However, since this technique forms a CCD channel so as to have a higher concentration and shallower structure, potential variations occur only locally during a transfer, the transfer electric field in the entire channel attenuates and transfer deterioration at the horizontal CCD outlet becomes more noticeable. For this reason, with micro cells of 2.0 μm or less in a CCD solid state image sensing element, characteristics such as the number of saturated electrons and horizontal transfer efficiency at the horizontal outlet become dominant and it is difficult to realize high-speed horizontal driving while maintaining a high number of saturated electrons. Especially, it is difficult to realize high-speed driving.

Furthermore, the horizontal CCD outlet is narrowed down so as to become gradually narrower than the width of the horizontal CCD at the repetition section to collect electrons at the FD section that follows the horizontal CCD outlet. However, since the number of saturated electrons also needs to be satisfied simultaneously, the horizontal CCD is drastically narrowed down at an end of an offset gate electrode which is the end of the horizontal outlet and at an end of the FD section. For this reason, this structure is liable to cause deterioration of a transfer from right below the offset gate electrode which is the end of the horizontal outlet to the FD section.

Therefore, in order to further proceed with high-speed horizontal driving by micro cells, a new well structure or layout needs to be introduced to the horizontal CCD outlet.

A conventional solid state image sensor designed for high-speed driving and improvement of horizontal transfer efficiency will be explained using FIG. 18 and FIG. 19.

FIG. 18 shows a schematic plan view of the horizontal CCD outlet of the solid state image sensor in a conventional example and FIG. 19 shows a cross-sectional view in a direction parallel to the charge transfer direction in the conventional example.

In FIG. 18, a region 302 including a gate electrode 312, gate electrode 313, gate electrode 314, gate electrode 315, gate electrode 316, gate electrode 317 and gate electrode 318 formed above an n-type region 310, p-type region 308 and p-type region 309 is the horizontal CCD outlet that sends signal electrons from a horizontal CCD to a voltage conversion section. A region 304 including the n-type region 310, an n-type region 324 and a gate electrode 319 formed above the n-type region 310 is a reset drain section that discharges signal electrons from the voltage conversion section. A region 303 interposed between the region 302 and region 304 is an FD section made up of the n-type region 310, p-type region 308, p-type region 309, contact 325 and AL wiring 327, for converting signal electrons to a voltage. The n-type region 310, which is the horizontal CCD in the region 302 being the horizontal outlet, is gradually narrowed down toward the region 303 being the FD section and drastically narrowed down to the width of the n-type region 310 in the region 303 being the FD section at an end adjoining the region 303 of the gate electrode 318.

The structure will further be explained using FIG. 19 which shows a cross section in a direction 301 parallel to the charge transfer direction including the gate electrode 312, gate electrode 313, gate electrode 314, gate electrode 315, gate electrode 316, gate electrode 317, gate electrode 318, region 303, gate electrode 319 and n-type region 324.

Furthermore, in FIG. 19, a p-type well 307 is formed in the depth of a semiconductor substrate 306. The p-type region 308 is formed in contact with the p-type well 307 on the surface side of the substrate 306. The p-type region 309 is formed in contact with and on the p-type region 308 on the surface side of the substrate 306. The n-type region 310 is formed in contact with the p-type region 309 on the surface of the substrate 306. The n-type region 310 and p-type region 309 are formed with a high concentration and shallowly to increase the number of electrons handled by pixel cells. A gate insulating film 311 is formed on the surface of the substrate 306 of the n-type region 310. The gate electrode 313, gate electrode 315 and gate electrode 317 are formed respectively through the gate insulating film 311. These gate electrodes are storage gates for accumulating signal electrons during a transfer by the horizontal CCD. Since the n-type region 310 and p-type region 309 of the region 302 which is the horizontal CCD outlet are shaped like a trapezoid narrowed down toward the region 303, the gate electrodes closer to the region 303 have a greater electrode length to secure the number of saturated electrons right below the gate electrode 313, gate electrode 315 and gate electrode 317 which are the respective storage gates of the region 302, which is the horizontal outlet.

There is a relationship as follows: gate length in horizontal repetition section<gate length of electrode 313<gate length of electrode 315<gate length of electrode 317. The gate electrode 314 is formed on the gate insulating film 311 so as to adjoin the gate electrode 313 and the gate electrode 315 through an insulating film 326. The gate electrode 316 is formed on the gate insulating film 311 so as to adjoin the gate electrode 315 and the gate electrode 317 through the insulating film 326. The gate electrode 318 is formed on the gate insulating film 311 so as to adjoin an end of the gate electrode 317 not adjoining the gate electrode 316 through the insulating film 326. The gate electrode 312 is formed on the gate insulating film 311 so as to adjoin an end of gate electrode 313 not adjoining the gate electrode 314 through the insulating film 326. In the n-type region 310, there are formed a p-type region 320 right below the gate electrode 312, a p-type region 321 right below the gate electrode 314, a p-type region 322 right below the gate electrode 316 and a p-type region 323 right below the gate electrode 318, respectively on the surface of the substrate 306. When transferring a signal using two-phase driving in the horizontal CCD, the p-type region 320, p-type region 321, p-type region 322 and p-type region 323 function as barriers to restrain backflow of signal electrons and promote the transfer. The horizontal CCD is made up of the n-type region 310, p-type region 309, p-type region 320, p-type region 321, p-type region 322 and p-type region 323. The gate electrode 319 to control discharge of signal electrons is formed next to the gate electrode 318. The n-type region 324 is formed in contact with the n-type region 310 right below the gate electrode 319. The region 304 including the gate electrode 319 and n-type region 324 is the reset drain section. The AL wiring 327 is connected to the contact 325 formed on the surface of the substrate 306 of the n-type region 310, penetrating through the insulating film 326 and gate insulating film 311 between an end of the gate electrode 318 not adjoining the gate electrode 317 and an end of the gate electrode 319 not adjoining the n-type region 324. The region 303 between the end of the gate electrode 318 not adjoining the gate electrode 317 and the end of the gate electrode 319 not adjoining the n-type region 324 is the FD section that performs signal electron-voltage conversion.

DISCLOSURE OF THE INVENTION

However, with the conventional configuration, gate electrodes located closer to the region 303 need to have a greater electrode length to secure the number of saturated electrons in the region 302 which is the horizontal CCD outlet. That is, the relationship: gate length in horizontal repetition section<gate length of electrode 313<gate length of electrode 315<gate length of electrode 317 needs to be maintained and the transfer time of a signal is longer at a location closer to the final stage of the region 302 which is the horizontal outlet and thus the transfer efficiency deteriorates. Moreover, for the purpose of increasing the number of electrons handled with the realization of cell miniaturization in pixel cells, the n-type region 310 and p-type region 309 are formed with a high concentration of impurities and shallowly, the potential during a transfer thus changes only locally, a region where the transfer electric field has significantly attenuated is likely to appear in the horizontal CCD and furthermore deterioration in the transfer efficiency in the region 302 which is the horizontal CCD outlet having a greater transfer gate electrode length becomes more noticeable.

The n-type region 310 in the region 302 is gradually narrowed down toward the region 303 which is the FD section and drastically narrowed down to the width of the n-type region 310 in the region 303 which is the FD section at a position at an end of the gate electrode 318 on the region 303 side, and therefore signal electrons existing at an end of the n-type region 310 in the region 302 which is the horizontal outlet must move to the central position where the region 303, the FD section, exists when the signal electrons come to the n-type region 310 right below the gate electrode 318. However, although the electric field in the signal electron transfer direction 301 is strong in the n-type region 310 right below the gate electrode 318, the potential right below the gate electrode 318 is substantially the same, and therefore the electric field strength from the end of the n-type region 310 toward the center is extremely weak and the transfer efficiency decreases significantly.

In order to solve the conventional problems, it is an object of the present invention to provide a solid state image sensor capable of improving transfer efficiency, increasing the number of saturated electrons and reducing transfer efficiency variations and saturation variations.

In order to attain the object, the solid state image sensor of the present invention is a solid state image sensor made up, on a first conductive type semiconductor substrate, of a horizontal transfer CCD section that receives signal electrons and transfers the signal electrons in a horizontal direction, an electron-voltage conversion section that converts the electrons transferred from the horizontal CCD section to a signal voltage and a reset drain section that discharges the electrons, including a first second conductive type impurity region formed on the first conductive type semiconductor substrate, a first first conductive type impurity region formed on the surface of the first conductive type semiconductor substrate in contact with the first second conductive type impurity region, a first insulating film formed on the first first conductive type impurity region, a reset gate formed on the first insulating film of the reset drain section, a second first conductive type impurity region formed on the surface of the first conductive type semiconductor substrate of the reset drain section, in contact with the first first conductive type impurity region, an offset gate formed on the first insulating film in a region adjoining the electron-voltage conversion section of the horizontal CCD section, at least two storage gates formed in parallel in an electron transfer direction on the first insulating film of the horizontal CCD section, at least one gate electrode formed one by one parallel to the storage gate between the respective storage gates, and a third first conductive type impurity region having a lower impurity concentration than the first first conductive type impurity region formed below a region including at least the offset gate in contact with the first second conductive type impurity region and the first first conductive type impurity region, the storage gate formed closest to the electron-voltage conversion section and the storage gate formed second closest to the electron-voltage conversion section, wherein the gate electrode length of the storage gate is increased as the distance from the electron-voltage conversion section becomes shorter and the regions where the first second conductive type impurity region, third first conductive type impurity region and first first conductive type impurity region of the horizontal CCD section are formed are narrowed down as the distance from the electron-voltage conversion section becomes shorter.

Furthermore, the gate electrode length of the offset gate and that of the storage gate in the region where the third first conductive type impurity region is formed are 0.7 μm or more.

Furthermore, there are two storage gates in the region where the third first conductive type impurity region is formed; the storage gate formed closest to the electron-voltage conversion section and the storage gate formed second closest to the electron-voltage conversion section.

Furthermore, the third first conductive type impurity region is extended to the electron-voltage conversion section.

Furthermore, the solid state image sensor of the present invention is a solid state image sensor made up, on a first conductive type semiconductor substrate, of a horizontal transfer CCD section that receives signal electrons and transfers the signal electrons in a horizontal direction, an electron-voltage conversion section that converts the electrons transferred from the horizontal CCD section to a signal voltage and a reset drain section that discharges the electrons, including a first second conductive type impurity region formed on the first conductive type semiconductor substrate, a first first conductive type impurity region formed on the surface of the first conductive type semiconductor substrate, a first insulating film formed on the first first conductive type impurity region, a reset gate formed on the first insulating film of the reset drain section, a second first conductive type impurity region formed on the surface of the first conductive type semiconductor substrate of the reset drain section, in contact with the first first conductive type impurity region, an offset gate formed on the first insulating film in a region adjoining the electron-voltage conversion section of the horizontal CCD section, at least two storage gates formed in parallel in an electron transfer direction on the first insulating film of the horizontal CCD section, at least one gate electrode formed one by one parallel to the storage gate between the respective storage gates, a third second conductive type impurity region formed in contact with the first second conductive type impurity region and the first first conductive type impurity region, a fourth second conductive type impurity region formed in contact with the first second conductive type impurity region and the first first conductive type impurity region and a fifth second conductive type impurity region having a lower impurity concentration than the third second conductive type impurity region and the fourth second conductive type impurity region, in contact with the first second conductive type impurity region and the first first conductive type impurity region, both ends in the electron transfer direction of which contact the third second conductive type impurity region and the fourth second conductive type impurity region, and being formed below a region including at least the offset gate, the storage gate formed closest to the electron-voltage conversion section and the storage gate formed second closest to the electron-voltage conversion section, wherein the gate electrode length of the storage gate is increased as the distance from the electron-voltage conversion section becomes shorter and the regions where the first second conductive type impurity region, third first conductive type impurity region and first first conductive type impurity region of the horizontal CCD section are formed are narrowed down as the distance from the electron-voltage conversion section becomes shorter.

Furthermore, the fifth second conductive type impurity region is extended to the electron-voltage conversion section.

Furthermore, the solid state image sensor of the present invention is a solid state image sensor made up, on a first conductive type semiconductor substrate, of a horizontal transfer CCD section that receives signal electrons and transfers the signal electrons in a horizontal direction, an electron-voltage conversion section that converts the electrons transferred from the horizontal CCD section to a signal voltage and a reset drain section that discharges the electrons, including a first second conductive type impurity region formed on the first conductive type semiconductor substrate, a first first conductive type impurity region formed on the surface of the first conductive type semiconductor substrate in contact with the first second conductive type impurity region, a first insulating film formed on the first first conductive type impurity region, a reset gate formed on the first insulating film of the reset drain section, a second first conductive type impurity region formed on the surface of the first conductive type semiconductor substrate of the reset drain section, in contact with the first first conductive type impurity region, an offset gate formed on the first insulating film in a region adjoining the electron-voltage conversion section of the horizontal CCD section, at least two storage gates formed in parallel in an electron transfer direction on the first insulating film of the horizontal CCD section and at least at least one gate electrode formed one by one parallel to the storage gate between the respective storage gates, wherein the gate electrode length of the storage gate is increased as the distance from the electron-voltage conversion section becomes shorter, the regions where the first second conductive type impurity region of the horizontal CCD section and the first first conductive type impurity region are formed are narrowed down as the distance from the electron-voltage conversion section becomes shorter and the region narrowed down of the first first conductive type impurity region extends to the electron-voltage conversion section.

DESCRIPTION OF THE EMBODIMENTS

Embodiment 1

The structure of a solid state image sensor according to Embodiment 1 will be explained using FIG. 1, FIG. 2 and FIG. 3.

Figure 1:
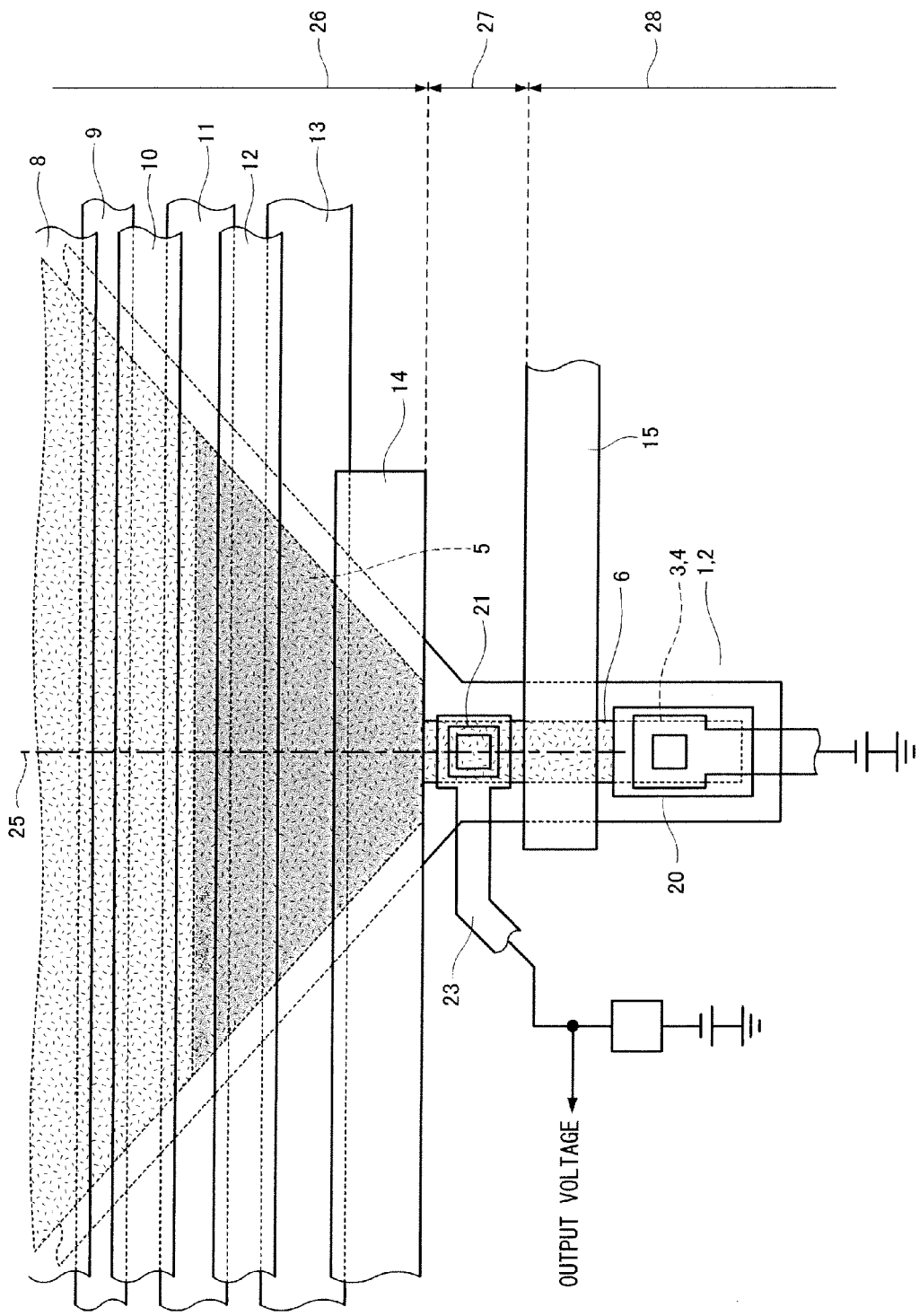
FIG. 1 is a schematic plan view of a horizontal CCD outlet of a solid state image sensor according to Embodiment 1.

FIG. 1 shows a schematic plan view of a horizontal CCD (horizontal transfer) outlet of the solid state image sensor according to Embodiment 1 of the present invention. Furthermore, FIG. 2 is a schematic cross-sectional view of the horizontal CCD outlet of the solid state image sensor according to Embodiment 1 and shows a cross section including a gate electrode 13 which is the final stage of a horizontal CCD, a gate electrode 14 which is an offset gate, a region 27, a gate electrode 15 which is a reset gate, and an n-type region 20 which is a reset drain and viewed along a direction 25 parallel to a charge transfer direction. FIG. 3 shows a depletion potential at the time of charge transfer in the horizontal CCD channel of the solid state image sensor of Embodiment 1.

In FIG. 1, a region 26 including a gate electrode 8, a gate electrode 9, a gate electrode 10, a gate electrode 11, a gate electrode 12, a gate electrode 13 and a gate electrode 14 formed above an n-type region 5, an n-type region 6, a p-type region 3 and a p-type region 4 is the horizontal CCD outlet that sends signal electrons from the horizontal CCD to a voltage conversion section. A region 28 including the n-type region 6, the n-type region 20, and the gate electrode 15 formed above the n-type region 6 is a reset drain section that discharges signal electrons from the voltage conversion section. The region 27 interposed between the region 26 and region 28 is a signal electron-voltage conversion section. The region 27 is constructed of the n-type region 6, p-type region 3, p-type region 4, a contact 21 and AL wiring 23. The n-type region 6, p-type region 3 and p-type region 4 of the region 26 which is the horizontal outlet have a trapezoidal shape narrowed down toward the region 27 which is the signal electron-voltage conversion section. The n-type region 5 is formed into a trapezoidal shape in the region 26, one end of which corresponds to a long side below the gate electrode 11, the other end of which corresponds to a short side matching an end of the gate electrode 14 on a region 27 side below the gate electrode 14 and the other sides of the n-type region 5 are formed so as to match the narrowed sides of the n-type region 6, p-type region 3 and p-type region 4. The region 26, region 27 and region 28 are partitioned in a direction perpendicular to the direction 25 parallel to the charge transfer direction.

Figure 2:
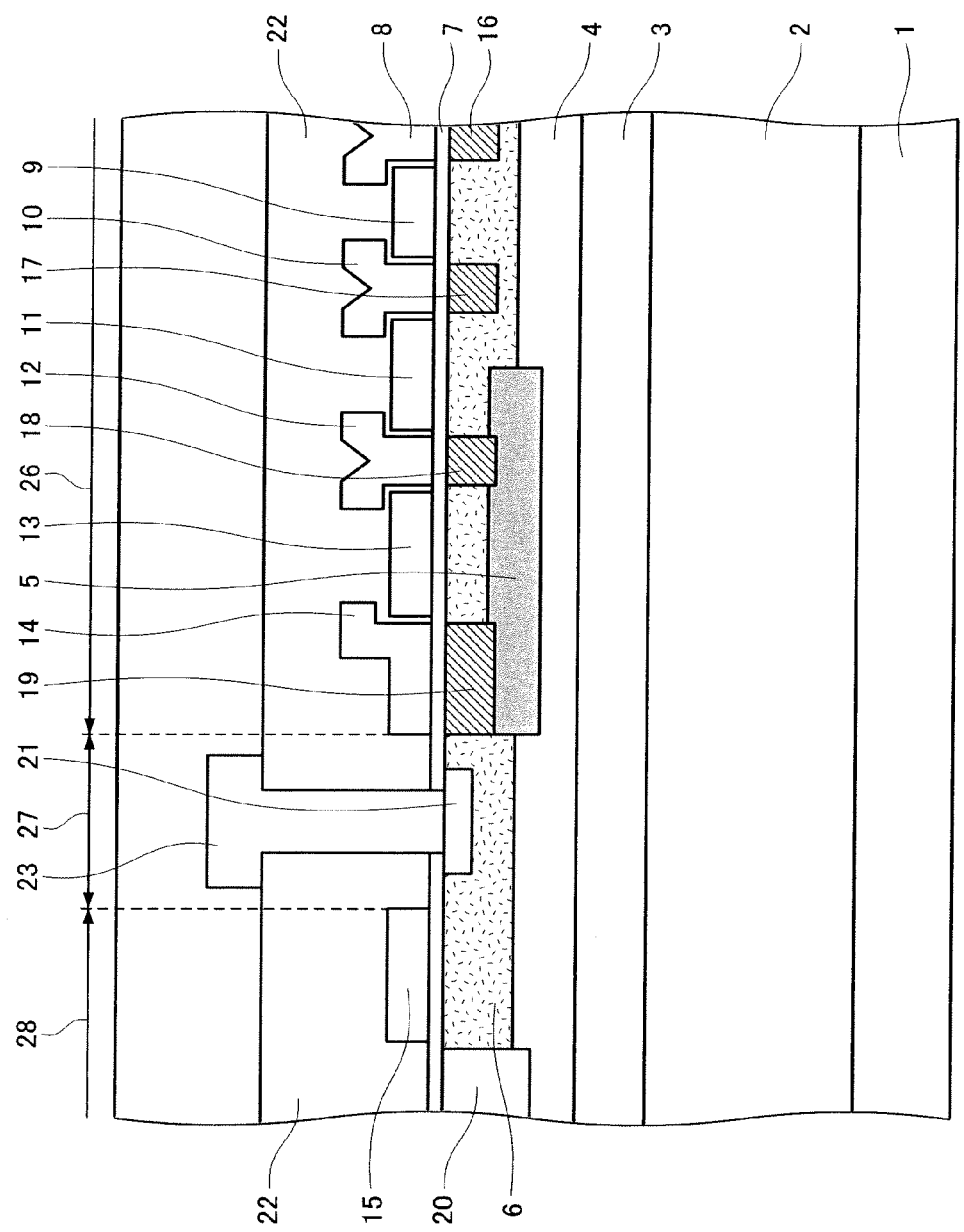
FIG. 2 is a schematic cross-sectional view of the horizontal CCD outlet of the solid state image sensor according to Embodiment 1.

In FIG. 2, a p-type well 2 of a low concentration is formed on an n-type semiconductor substrate 1. Impurities in the p-type well 2 are set to a concentration of $1 \times 10^{14}$ cm$^{-3}$ or more to suppress backflow of electrons from the substrate 1. Setting impurities to this concentration prevents backflow of electrons from the substrate 1 even when, for example, a supply voltage of 15 V or 12 V is applied to the n-type region 20 at the time of a reset operation for sweeping signal electrons.

Furthermore, the p-type region 3 is selectively formed in contact with the p-type well 2 on the p-type well 2 on the Si surface side of the substrate 1. The p-type region 4 is formed in contact with the p-type region 3 on the surface side of the substrate 1 in the p-type region 3. The n-type region 6 is formed in contact with the p-type region 4 on the surface of the substrate 1. A gate insulating film 7 is formed on the surface of the substrate 1 in the n-type region 6.

The gate electrode 9, gate electrode 11 and gate electrode 13 are formed respectively through the gate insulating film 7. The gate electrode 9, gate electrode 11 and gate electrode 13 function as storage gates that accumulate signal electrons at the time of transfer in the horizontal CCD. Especially, the gate electrode 13 is a gate electrode at the final stage of the horizontal CCD.

Since the n-type region 6, p-type region 3 and p-type region 4 in the region 26 which is the horizontal CCD outlet are configured in a trapezoidal shape narrowed down toward the region 27, gate electrodes closer to the region 27 have longer electrodes to secure the number of saturated electrons in each storage gate at the horizontal outlet. There is a relationship as follows: gate length in horizontal repetition section<gate length of electrode 9<gate length of electrode 11<gate length of electrode 13.

The gate electrode 10 is formed on the gate insulating film 7 so as to adjoin the gate electrode 9 and the gate electrode 11 through an insulating film 22. The gate electrode 12 is formed on the gate insulating film 7 so as to adjoin the gate electrode 11 and the gate electrode 13 through the insulating film 22.

Furthermore, the gate electrode 8 is formed on the gate insulating film 7 so as to adjoin an end of the gate electrode 9 not adjoining the gate electrode 10 through the insulating film 22.

Furthermore, the gate electrode 14 is formed on the gate insulating film 7 so as to adjoin an end of the gate electrode 13 not adjoining the gate electrode 12 through the insulating film 22. Inside the n-type region 6, there are formed a p-type region 16 right below the gate electrode 8, a p-type region 17 right below the gate electrode 10, a p-type region 18 right below the gate electrode 12 and a p-type region 19 right below the gate electrode 14, respectively, on the surface of the substrate 1.

Furthermore, providing the p-type region 16 right below the gate electrode 8, the p-type region 17 right below the gate electrode 10 and the p-type region 18 right below the gate electrode 12 allows these gate electrodes to function as barrier gates for suppressing backflow of signal electrons when transferring signals through the horizontal CCD using two-phase driving and promoting the transfer.

Furthermore, the gate electrode 14 is located at the end of the region 26 which is the horizontal outlet and is called an "offset gate (OG)." The transfer of signal electrons and the number of saturated electrons at the gate electrode 13 which is the horizontal final stage and the gate electrode 12 are determined by the voltage applied to the gate electrode 14.

Furthermore, inside the substrate 1, the n-type region 5 having a lower concentration than the n-type region 6 is surrounded by the p-type region 4 on the depth side and by the n-type region 6 on the surface side and formed ranging from the gate electrode 11 to the gate electrode 12, gate electrode 13 and gate electrode 14. Forming the n-type region 5 at a lower concentration than the n-type region 6 can increase the electric field strength at the time of transfer and also increase the n-type concentration in the horizontal CCD, and thereby improve the transfer of signal electrons in the region 26 which is the horizontal outlet and also increase the number of saturated electrons.

Furthermore, the horizontal CCD is constructed of the n-type region 5, n-type region 6, p-type region 4, p-type region 16, p-type region 17, p-type region 18 and p-type region 19. The gate electrode 15 is formed next to the gate electrode 14 to control discharge of signal electrons.

Furthermore, the n-type region 20 is formed in contact with the n-type region 6 right below the gate electrode 15. The n-type region 20 has the function of a reset drain to discharge signal electrons. The region 28 including the gate electrode 15 and the n-type region 20 is the reset drain section. The AL wiring 23 penetrating through the insulating film 22 and gate insulating film 7 between the end of the gate electrode 14 not adjoining the gate electrode 13 and the end of the gate electrode 15 not adjoining the n-type region 20 is connected to the contact 21 formed on the surface of the substrate 1 of the n-type region 6.

The region 27 between the end of the gate electrode 14 not adjoining the gate electrode 13 and the end of the gate electrode 15 not adjoining the n-type region 20 is the signal electron-voltage conversion section.

In FIG. 2, the gate insulating film 7 is selectively formed in contact with the substrate 1. The insulating film 22 is formed in contact with the gate insulating film 7. The gate electrode 11 and gate electrode 13 are formed on the gate insulating film 7 respectively. The gate electrode 12 is formed on the gate insulating film 7 through the insulating film 22 so as to adjoin the gate electrode 11 and the gate electrode 13. The gate electrode 10 is formed on the gate insulating film 7 through the insulating film 22 so as to adjoin an end of the gate electrode 11 not adjoining the gate electrode 12. The gate electrode 14 is formed on the gate insulating film 7 through the insulating film 22 so as to adjoin the end of the gate electrode 13 not adjoining the gate electrode 12. The p-type region 4 is selectively formed in the p-type well 2 formed in the substrate 1. The n-type region 6 is formed on the surface of the substrate 1 to be in contact with the p-type region 4.

The n-type region 5 having a lower concentration than the n-type region 6 is surrounded by the p-type region 4 on the depth side and by the n-type region 6 on the surface side, and formed ranging from the gate electrode 11 to the gate electrode 12, gate electrode 13 and gate electrode 14 in the substrate 1.

As described above, forming the n-type region 5 having a lower concentration than the n-type region 6 to be surrounded by the p-type region 4 on the depth side and by the n-type region 6 on the surface side, ranging from the gate electrode 11 to the gate electrode 12, gate electrode 13 and gate electrode 14 in the substrate 1 makes it possible to enhance the electric field strength at the time of transfer, also to increase the n-type concentration in the horizontal CCD, thereby manufacturing a solid state image sensor capable of improving the transfer efficiency at the horizontal outlet and increasing the number of saturated electrons.

Next, the mechanism capable of improving the transfer efficiency and increasing the number of saturated electrons at the horizontal outlet will be explained using FIG. 2 and FIG. 3.

Figure 3:
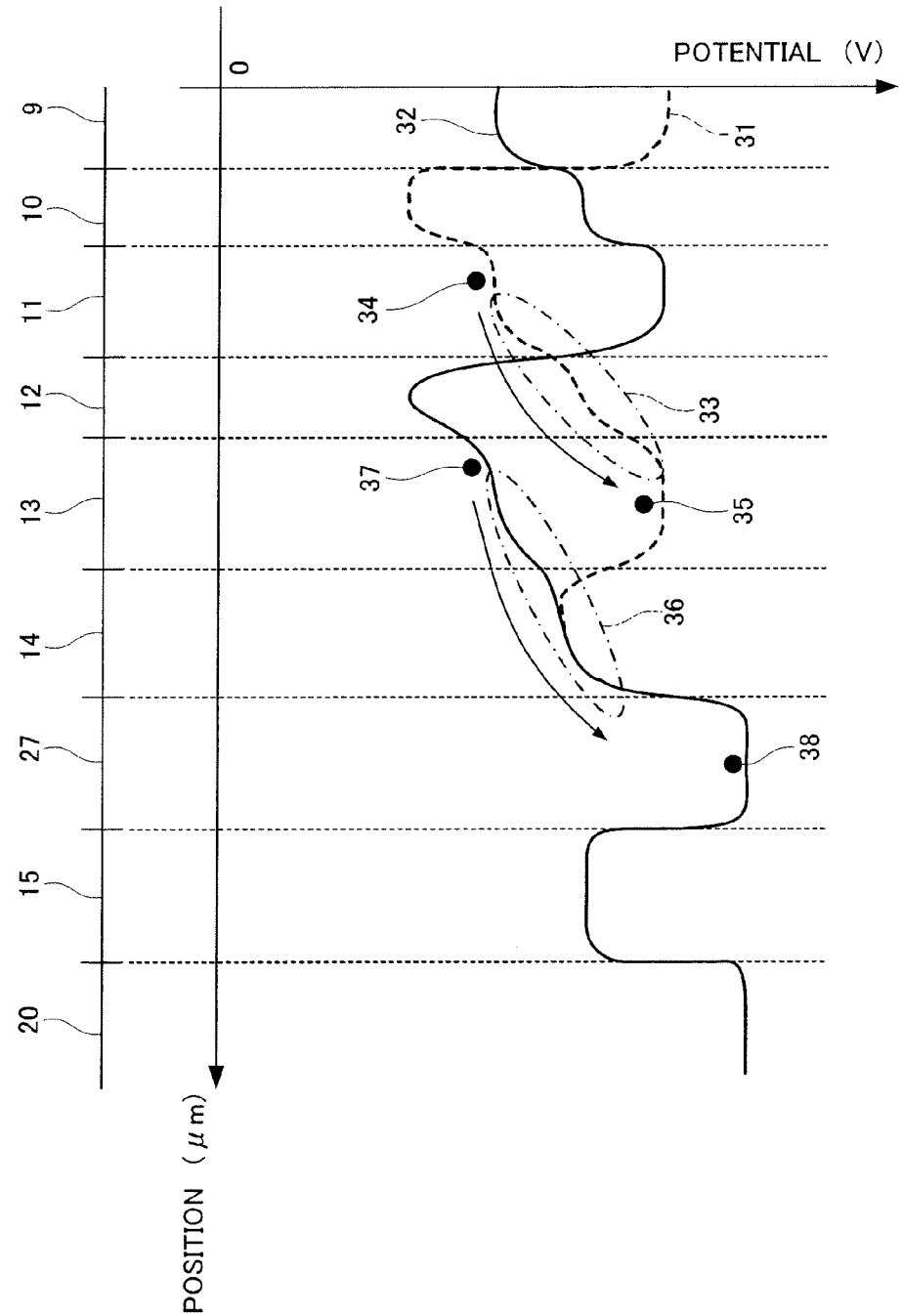
FIG. 3 shows a depletion potential at the time of charge transfer in the horizontal CCD channel of the solid state image sensor according to Embodiment 1.

FIG. 3 is a depletion potential diagram at the time of transfer when the horizontal CCD is driven with two phases in the n-type region 6 which is the horizontal CCD channel in the direction 25 parallel to the charge transfer direction, ranging from the gate electrode 9 to the gate electrode 13 at the horizontal outlet, gate electrode 14 which is the offset gate, region 27, gate electrode 15 which is the reset gate and the n-type region 20 which is the reset drain. A dotted line 31 shows a potential distribution when signal electrons are transferred from below the gate electrode 11 immediately preceding the horizontal final stage to below the gate electrode 13 which is the final stage. A chain line 33 indicates a potential distribution at the time of transfer and shows the transfer potential distribution below the gate electrode 11, gate electrode 12 and gate electrode 13 shown by the dotted line 31. An electron 34 is a signal electron below the gate electrode 11 before a transfer, an electron 35 is a signal electron accumulated below the gate electrode 13 after a transfer. A solid line 32 shows a potential distribution when a signal electron is transferred from below the gate electrode 13 which is the final stage of the horizontal outlet to the region 27 which is the signal electron conversion section. A chain line 36 shows a potential distribution at the time of transfer and a potential distribution below the gate electrode 13 and gate electrode 14 shown by the solid line 32. An electron 37 is a signal electron accumulated below the gate electrode 13 before a transfer and an electron 38 is a signal electron of the region 27 after a transfer. Reference numerals 9 to 15 and 20, 27 shown in the partitioned regions indicate reference numerals of the components in FIG. 1 and FIG. 2.

As shown in FIG. 2, according to this embodiment, the n-type region 5 is formed in the horizontal CCD, ranging from below the gate electrode 11 immediately preceding the horizontal final stage, which is longer than the gate electrode of the horizontal repetition section where transfer deterioration is predicted to occur, to below the gate electrode 12, the gate electrode 13 which is the final stage and the gate electrode 14 which is the offset gate.

In FIG. 3, at the time of transfer from below the gate electrode 11 immediately preceding the final stage of the horizontal outlet to the gate electrode 13 of the final stage, the potential distribution becomes as shown by the dotted line 31. Since the n-type region 5 having a lower concentration than the n-type region 6 is formed in the depth of the substrate, in contact with the n-type region 6, ranging from below the gate electrode 11 to below the gate electrode 12 and gate electrode 13, drastic variations of the potential distribution at the time of transfer can be suppressed and it is thereby possible to smooth the potential at the time of transfer in the CCD below the gate electrode 11, gate electrode 12 and gate electrode 13 shown by the chain line 33 and average the potential gradient.

It is thereby possible to eliminate the flat part of the potential below the gate electrode 11 and gate electrode 12 and enhance the signal transfer electric field from below the gate electrode 11 to below the gate electrode 13. Furthermore, since the impurity concentration of the n-type layer in the horizontal CCD can be made to correspond to the sum of impurity concentrations of the n-type region 5 and n-type region 6, it is possible to increase the total impurity concentration that can contribute to signal electrons and increase the number of horizontal saturated electrons determined below the gate electrode 13 which is the horizontal final stage having the smallest area among the gate electrodes in the horizontal CCD in which signals are accumulated.

At the time of transfer from below the gate electrode 13 at the final stage of the horizontal outlet to the region 27, the potential distribution is as shown by the solid line 32. Since the n-type region 5 having a lower concentration than the n-type region 6 is formed below the gate electrode 13 and gate electrode 14, it is possible to smooth the potential distribution at the time of transfer within the CCD below the gate electrode 13 and gate electrode 14 shown by the chain line 36 and average the potential gradient.

In this way, it is possible to eliminate the flat part of potential below the gate electrode 11 and gate electrode 12 and enhance the signal transfer electric field from below the gate electrode 13 to the region 27. Therefore, the transfer efficiency at the horizontal outlet can be improved.

The n-type region 5 is formed for the purpose of strengthening the transfer electric field, and therefore the n-type region 5 is formed from the gate electrode 11 to the gate electrode 14 in this embodiment, but when the influence of transfer deterioration is large, a structure formed below the gate electrode 9, and moreover, below a plurality of gate electrodes may also be adopted.

As described above, according to this Embodiment 1, it is possible to manufacture a solid state image sensor including a first insulating film selectively formed in contact with a semiconductor substrate, a second insulating film formed in contact with and on the first insulating film, first and second gate electrodes formed on the first insulating film, a third gate electrode formed on the first insulating film so as to adjoin the first and second gate electrodes through the second insulating film, a fourth gate electrode formed on the first insulating film so as to adjoin an end of the first gate electrode not adjoining the third gate electrode through the second insulating film, a fifth gate electrode formed on the first insulating film so as to adjoin an end of the second gate electrode not adjoining the third gate electrode through the second insulating film, a first p-type diffusion layer which is a p-type region formed on the semiconductor substrate, a first n-type diffusion layer which is an n-type region formed on the surface of the semiconductor substrate, in contact with the first p-type diffusion layer, and a second n-type diffusion layer, which is, on the depth side of the semiconductor substrate, surrounded by the first p-type diffusion layer, which is, on the surface side thereof, surrounded by the first n-type diffusion layer, and which is an n-type region having a lower concentration than the first n-type diffusion layer formed ranging from the first to third, second and fifth gate electrodes, and thus capable of improving the transfer efficiency at a horizontal outlet and increasing the number of saturated electrons.

Embodiment 2

The structure of a solid state image sensor according to Embodiment 2 will be explained using FIG. 4 and FIG. 5.

Figure 4:
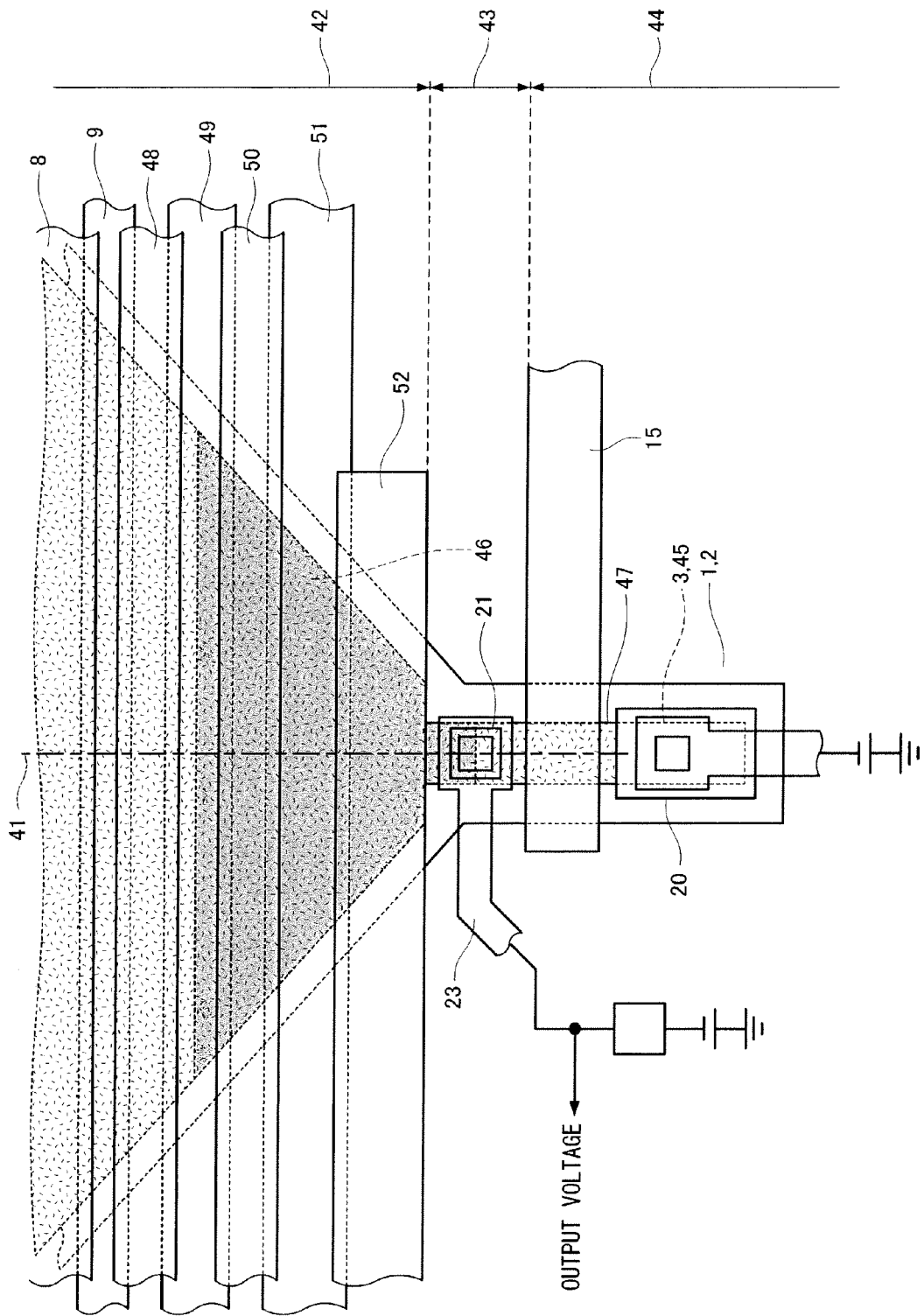
FIG. 4 is a schematic plan view of a horizontal CCD outlet of a solid state image sensor according to Embodiment 2.

FIG. 4 shows a schematic plan view of a horizontal CCD outlet of the solid state image sensor according to Embodiment 2 of the present invention. FIG. 5 shows a schematic cross sectional view of the horizontal CCD outlet of the solid state image sensor according to Embodiment 2, which is a cross section in a direction 41 parallel to a charge transfer direction, including a gate electrode 51 which is a horizontal CCD final stage, a gate electrode 52 which is an offset gate, a region 43, a gate electrode 15 which is a reset gate and an n-type region 20 which is a reset drain.

First, this embodiment will be explained using FIG. 4 and FIG. 5. However, the same reference numerals as those in FIG. 1 and FIG. 2 indicate identical parts and explanations thereof will be omitted here.

In FIG. 4, a region 42 including a gate electrode 8, gate electrode 9, gate electrode 48, gate electrode 49, gate electrode 50, gate electrode 51 and gate electrode 52 formed above an n-type region 46, n-type region 47, p-type region 3 and p-type region 45 is the horizontal CCD outlet that sends signal electrons from a horizontal CCD to a voltage conversion section.

A region 44 including the n-type region 47, n-type region 20 and gate electrode 15 formed above the n-type region 47 is a reset drain section that discharges signal electrons from the voltage conversion section. The region 43 interposed between the region 42 and region 44 is a signal electron-voltage conversion section.

The region 43 is constructed of the n-type region 46, n-type region 47, the p-type region 3, the p-type region 45, a contact 21 and AL wiring 23. The n-type region 47, p-type region 3 and p-type region 45 of the region 42 which is the horizontal outlet are configured into a trapezoidal shape narrowed down toward the region 43 which is the signal electron-voltage conversion section. The n-type region 46 is formed into a trapezoidal shape in the region 42, one end of which corresponds to the long side below the gate electrode 49, the other end of which corresponds to the short side matching an end of the gate electrode 52 on the region 43 side below the gate electrode 52 and the other sides of which are formed in a trapezoidal shape in the region 42 so as to match the narrowed sides of the n-type region 47, p-type region 3 and p-type region 45, and the center of the n-type region 46 is formed penetrating into the region 43 along the n-type region 47, p-type region 3 and p-type region 45. The region 42, region 43 and region 44 are partitioned in a direction perpendicular to the direction 41 parallel to the charge transfer direction.

Figure 5:
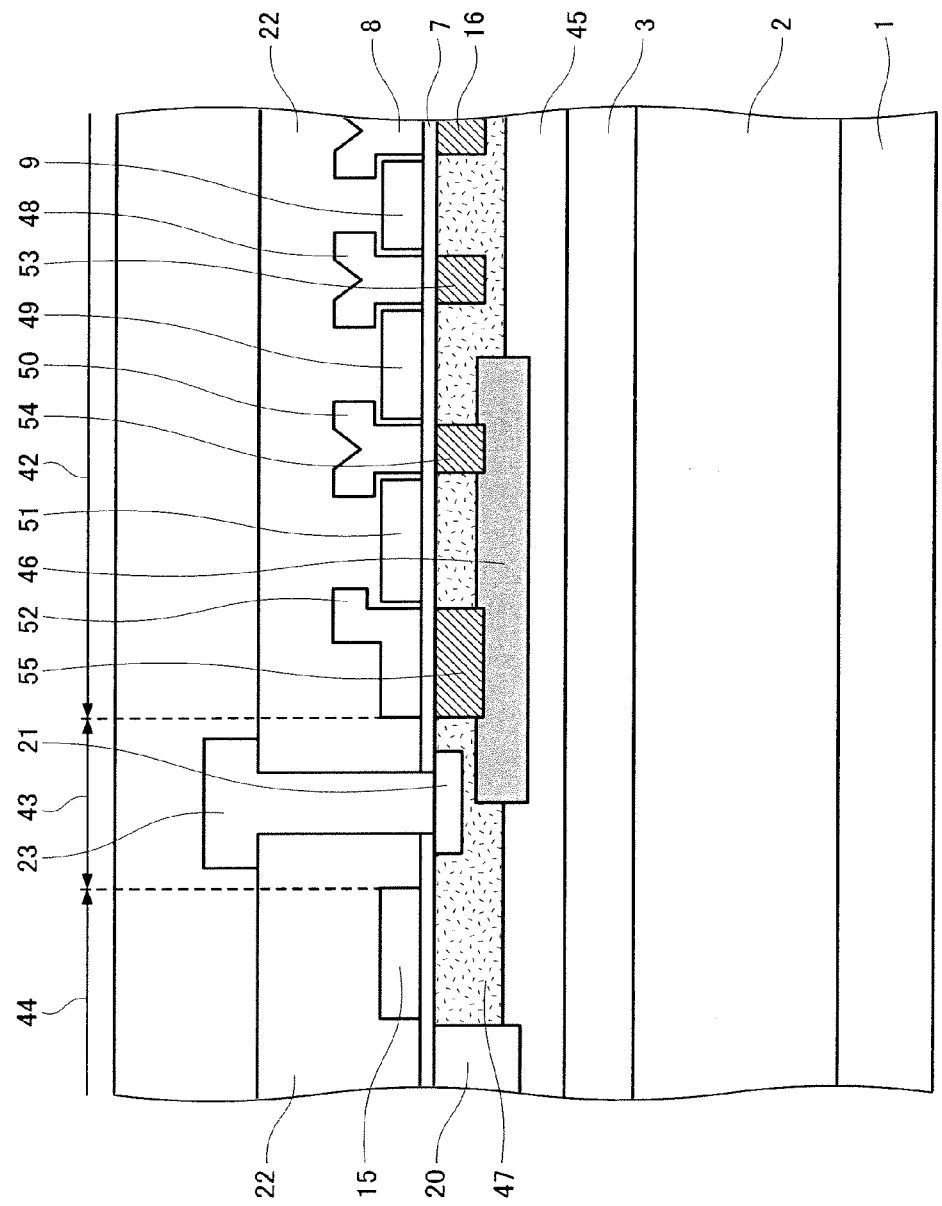
FIG. 5 is a schematic cross-sectional view of the horizontal CCD outlet of the solid state image sensor according to Embodiment 2.

In FIG. 5, the p-type region 45 is formed in contact with the p-type region 3 selectively formed in a semiconductor substrate 1 on the p-type region 3 on the surface side of the substrate 1. The n-type region 47 is formed in contact with the p-type region 45 on the surface of the substrate 1. A gate insulating film 7 is formed on the n-type region 47 on the surface of the substrate 1. The gate electrode 49 and the gate electrode 51 are formed through the gate insulating film 7 respectively. The gate electrode 9, gate electrode 49 and gate electrode 51 function as storage gates for accumulating signal electrons in the horizontal CCD at the time of transfer.

Especially, the gate electrode 51 is the gate electrode which is the final stage of the horizontal CCD. Since the region 42, which is the horizontal CCD outlet, is configured narrowed down toward the region 43, gate electrodes closer to the region 43 have longer electrodes to secure the number of saturated electrons at each storage gate of the horizontal outlet. That is, there is a relationship as follows: gate length in horizontal repetition section<gate length of electrode 9<gate length of electrode 49<gate length of electrode 51.

The gate electrode 48 is formed on the gate insulating film 7 so as to adjoin the gate electrode 9 and the gate electrode 49 through the insulating film 22. The gate electrode 50 is formed on the gate insulating film 7 so as to adjoin the gate electrode 49 and the gate electrode 51 through the insulating film 22. The gate electrode 52 is formed on the gate insulating film 7 so as to adjoin an end of the gate electrode 51 not adjoining the gate electrode 50 through the insulating film 22.

In the n-type region 47, there are formed a p-type region 53 right below the gate electrode 48, a p-type region 54 right below the gate electrode 50 and a p-type region 55 right below the gate electrode 52 on the surface of the substrate 1 respectively.

Providing a p-type region 16 right below the gate electrode 8, the p-type region 53 right below the gate electrode 48 and the p-type region 54 right below the gate electrode 50 respectively allows these gate electrodes to function as barrier gates for suppressing backflow of signal electrons when transferring signals through the horizontal CCD using two-phase driving and promoting the transfer. The gate electrode 52 is located at the end of the region 42 which is the horizontal outlet and is called an "offset gate (OG)." The transfer of signal electrons and the number of saturated electrons at the gate electrode 51 which is the horizontal final stage and the gate electrode 50 are determined by the voltage applied to the gate electrode 52.

In the substrate 1, the n-type region 46 having a lower concentration than the n-type region 47 is surrounded by the p-type region 45 on the depth side and by the n-type region 47 on the surface side and formed ranging from right below the gate electrode 49 to right below the gate electrode 50, gate electrode 51 and gate electrode 52, extending beyond the gate electrode 52 to the region 43 which is the signal electron-voltage conversion section.

The horizontal CCD is constructed of the n-type region 46, n-type region 47, p-type region 45, p-type region 16, p-type region 53, p-type region 54 and p-type region 55. Forming the n-type region 46 with a lower n-type impurity concentration than the n-type region 47 can increase the electric field strength at the time of transfer and also increase the n-type concentration in the horizontal CCD, thereby improving the transfer of signal electrons in the region 42 which is the horizontal outlet and increasing the number of saturated electrons. Since the mechanism capable of improving the transfer and increasing the number of saturated electrons is the same as aforementioned Embodiment 1, explanations thereof will be omitted.

Furthermore, since the n-type region 46 is formed extending beyond the gate electrode 52 to the region 43, it is possible to keep the low n-type impurity concentration right below the n-type region 47 below the gate electrode 52 on the boundary with the region 43 even when the impurity concentration of the n-type region 46 changes and to thereby maintain the potential right below the gate electrode 52 at the time of transfer in a smooth condition and the potential below the gate electrode 52, which is the offset gate, is less likely to be affected than when the end of the n-type region 46 exists below the gate electrode 52.

Therefore, since the potential in the horizontal CCD right below the gate electrode 52 at the end of the horizontal outlet can be formed stably, transfer variations and variations in the number of saturated electrons can be suppressed. Since the n-type region 46 is formed for the purpose of strengthening the transfer electric field, the n-type region 46 is formed from the gate electrode 49 to the gate electrode 52 in this embodiment, but a structure in which the n-type region 46 is formed below a plurality of gate electrodes may also be adopted.

In FIG. 5, the gate electrode 49 and the gate electrode 51 are formed on the gate insulating film 7 selectively formed in contact with the substrate 1. The gate electrode 50 is formed on the gate insulating film 7 so as to adjoin the gate electrode 49 and the gate electrode 51 through the insulating film 22. The gate electrode 48 is formed on the gate insulating film 7 so as to adjoin an end of the gate electrode 49 not adjoining the gate electrode 50 through the insulating film 22. The gate electrode 52 is formed on the gate insulating film 7 so as to adjoin an end of the gate electrode 51 not adjoining the gate electrode 50 through the insulating film 22.

Furthermore, the p-type region 45 is selectively formed in the p-type well 2 formed in the substrate 1. The n-type region 47 is formed on the surface of the substrate 1, in contact with the p-type region 45. In the substrate 1, the n-type region 46 having a lower concentration than the n-type region 47 is surrounded by the p-type region 45 on the depth side, by the n-type region 47 on the surface side, and formed ranging from right below the gate electrode 49 to right below the gate electrode 50, gate electrode 51 and the gate electrode 52 and extending beyond the gate electrode 52 to the region 43 which is the signal electron-voltage conversion section.

As described above, forming the n-type region 46 having a lower concentration than the n-type region 47 in the substrate 1 to be surrounded by the p-type region 45 on the depth side and by the n-type region 47 on the surface side, ranging from right below the gate electrode 49, gate electrode 50, gate electrode 51 and right below the gate electrode 52 and extending beyond the gate electrode 52 to the region 43 which is the signal electron-voltage conversion section makes it possible to keep the n-type impurity concentration right below the n-type region 47 below the gate electrode 52 on the boundary with the region 43 to a low concentration, keep the potential right below the gate electrode 52 at the time of transfer to a smooth condition, and thereby manufacture a solid state image sensor capable of improving the transfer of signal electrons at the horizontal outlet, increasing the number of saturated electrons and suppressing transfer variations and variations in the number of saturated electrons.

As described above, according to this Embodiment 2, it is possible to manufacture a solid state image sensor including a first insulating film selectively formed in contact with a semiconductor substrate, a second insulating film formed in contact with and on the first insulating film, first and second gate electrodes formed on the first insulating film, a third gate electrode formed on the first insulating film so as to adjoin the first and second gate electrodes through the second insulating film, a fourth gate electrode formed on the first insulating film so as to adjoin an end of the first gate electrode not adjoining the third gate electrode through the second insulating film, a fifth gate electrode formed on the first insulating film so as to adjoin an end of the second gate electrode not adjoining the third gate electrode through the second insulating film, a signal electron-voltage conversion section formed adjoining the fifth gate electrode, a first p-type diffusion layer formed on the semiconductor substrate, a first n-type diffusion layer formed on the surface of the semiconductor substrate, in contact with the first p-type diffusion layer, and a second n-type diffusion layer having a lower concentration than the first n-type diffusion layer surrounded by the first p-type diffusion layer on the depth side of the semiconductor substrate, by the first n-type diffusion layer on the surface side and formed ranging from right below the first gate electrode to right below the third, second and fifth gate electrodes and extending beyond the fifth gate electrode to the signal electron-voltage conversion section, and thereby improving the transfer efficiency at a horizontal outlet and increasing the number of saturated electrons.

Embodiment 3

The structure of a solid state image sensor according to Embodiment 3 will be explained using FIG. 6, FIG. 7 and FIG. 8.

Figure 6:
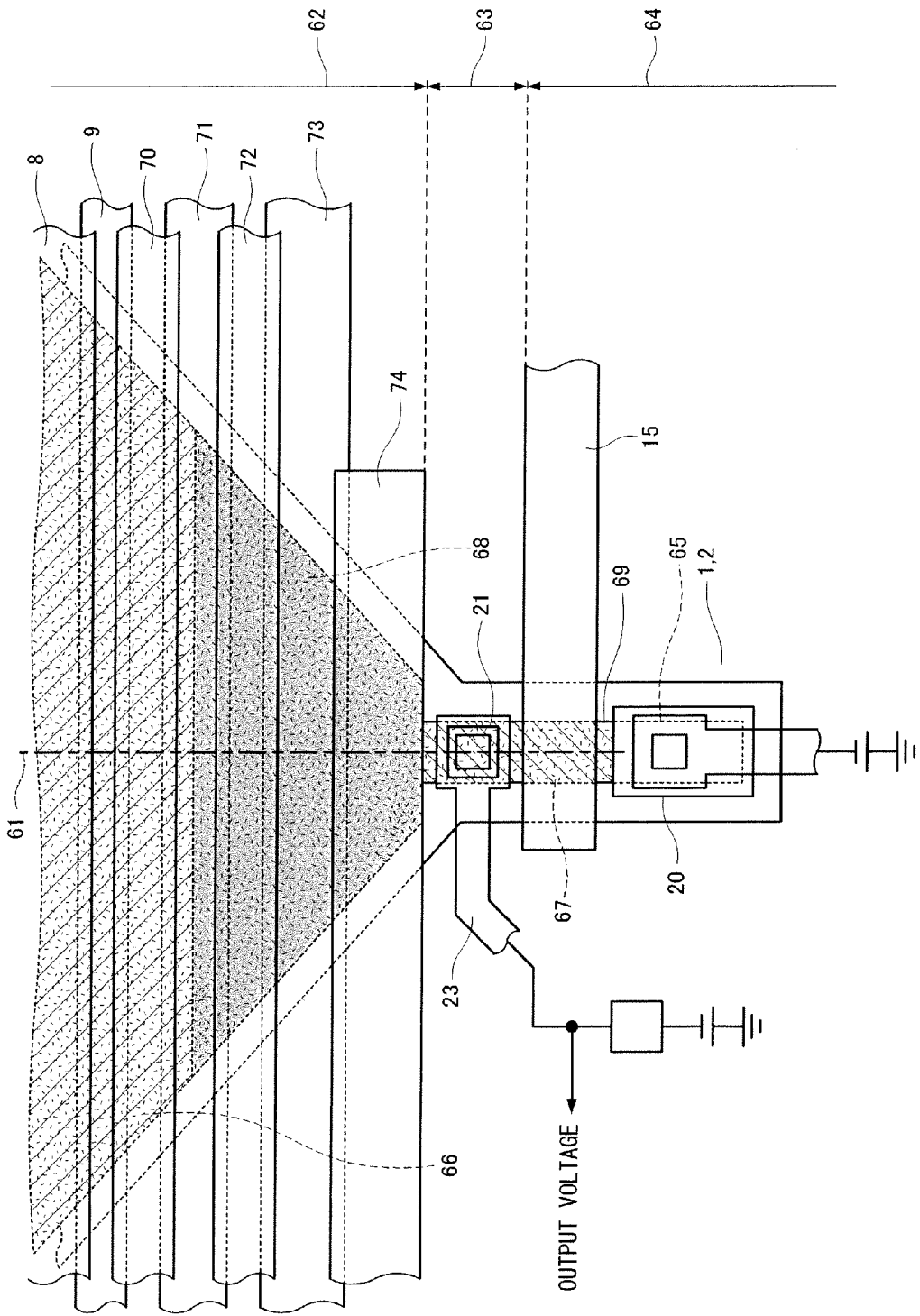
FIG. 6 is a schematic plan view of a horizontal CCD outlet of a solid state image sensor according to Embodiment 3.

FIG. 6 shows a schematic plan view of a horizontal CCD outlet of the solid state image sensor according to Embodiment 3 of the present invention. FIG. 7 is a schematic cross-sectional view of the horizontal CCD outlet of the solid state image sensor according to Embodiment 3, which is a cross section in a direction 61 parallel to a charge transfer direction, including a gate electrode 73 which is a horizontal CCD final stage, a gate electrode 74 which is an offset gate, a region 63, a gate electrode 15 which is a reset gate and an n-type region 20 which is a reset drain. FIG. 8 shows a depletion potential in the horizontal CCD channel of the solid state image sensor according to Embodiment 3 at the time of charge transfer.

First, the configuration will be explained using FIG. 6 and FIG. 7. However, the same reference numerals as those in FIG. 1 and FIG. 2 indicate identical parts and explanations thereof will be omitted here.

In FIG. 6, a region 62 including a gate electrode 8, a gate electrode 9, a gate electrode 70, a gate electrode 71, a gate electrode 72, a gate electrode 73 and a gate electrode 74 formed above an n-type region 68, an n-type region 69, a p-type region 65 and a p-type region 66 is the horizontal CCD outlet that sends signal electrons from a horizontal CCD to a voltage conversion section.

A region 64 including the gate electrode 15 formed above the n-type region 69, a p-type region 67, the n-type region 20 and the n-type region 69 is a reset drain section that discharges signal electrons from the voltage conversion section. The region 63 interposed between the region 62 and region 64 is a signal electron-voltage conversion section. The region 63 is constructed of the n-type region 69, the p-type region 65, the p-type region 67, a contact 21 and an AL wiring 23. The n-type region 68 of the region 62 which is the horizontal outlet, the n-type region 69 and the p-type region 66 are configured into a trapezoidal shape narrowed down toward the region 63 which is the signal electron-voltage conversion section.

Figure 7:
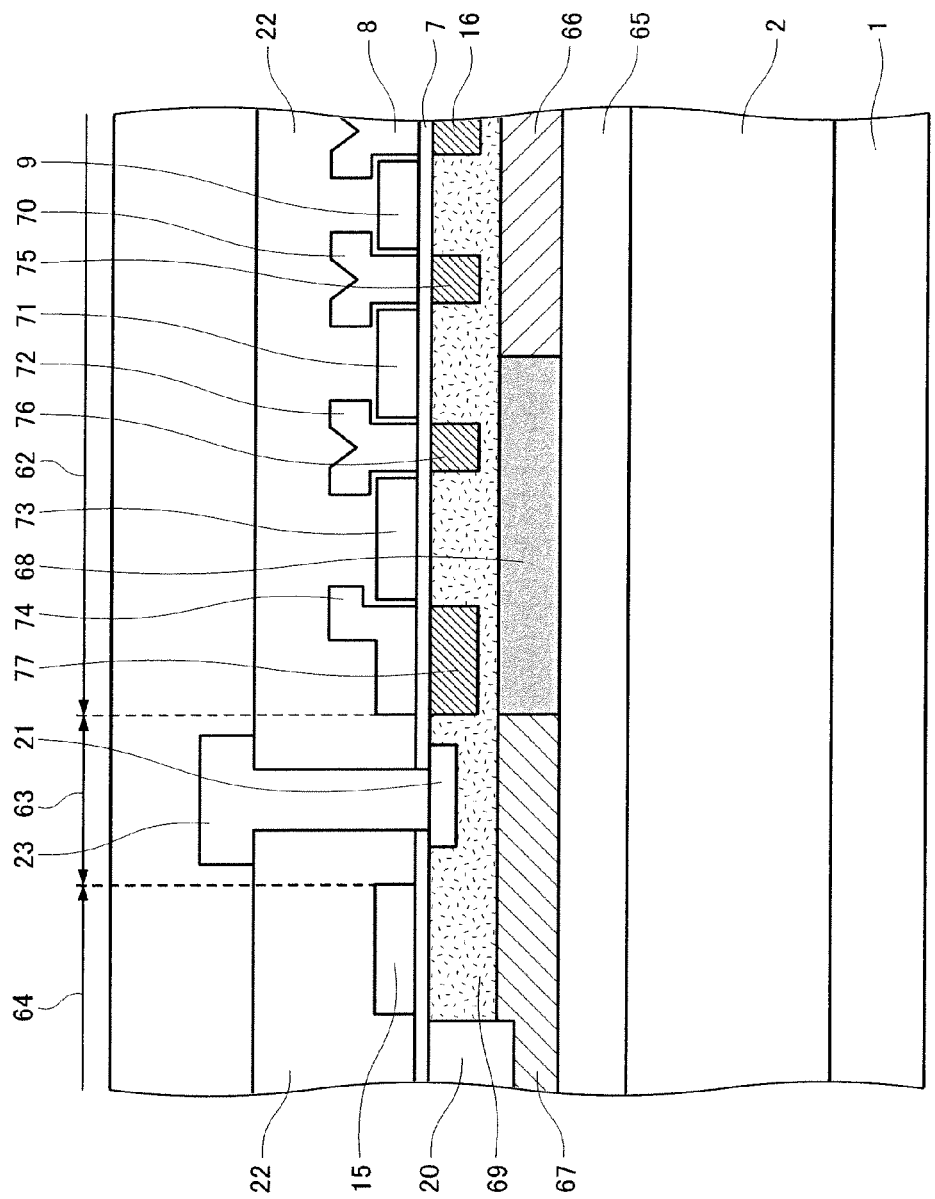
FIG. 7 is a schematic cross-sectional view of the horizontal CCD outlet of the solid state image sensor according to Embodiment 3.

In FIG. 7, the gate electrode 71 and the gate electrode 73 are formed through a gate insulating film 7 formed, in contact with the surface of an n-type semiconductor substrate 1. The gate electrode 71 and gate electrode 73 function as storage gates for accumulating signal electrons in the horizontal CCD at the time of transfer.

Especially, the gate electrode 73 is a gate electrode which is the final stage of the horizontal CCD. Since the region 62, which is the horizontal CCD outlet, is configured in a shape narrowed down toward the region 63, gate electrodes closer to the region 63 have longer electrodes to secure the number of saturated electrons at each storage gate of the horizontal outlet. There is a relationship as follows: gate length in horizontal repetition section<gate length of electrode 9<gate length of electrode 71<gate length of electrode 73. The gate electrode 70 is formed on the gate insulating film 7 so as to adjoin the gate electrode 9 and the gate electrode 71 through an insulating film 22. The gate electrode 72 is formed on the gate insulating film 7 so as to adjoin the gate electrode 71 and the gate electrode 73 through the insulating film 22. The gate electrode 74 is formed on the gate insulating film 7 so as to adjoin an end of the gate electrode 73 not adjoining the gate electrode 72 through the insulating film 22.

In the n-type region 69, there are formed a p-type region 75 right below the gate electrode 70, a p-type region 76 right below the gate electrode 72 and a p-type region 77 right below the gate electrode 74 on the surface of the substrate 1 respectively. Providing the p-type region 75 right below the gate electrode 70 and the p-type region 76 right below the gate electrode 72 respectively allows these gate electrodes to function as barrier gates for suppressing backflow of signal electrons when transferring signals through the horizontal CCD using two-phase driving and promoting the transfer.

The gate electrode 74 is located at the end of the region 62 which is the horizontal outlet and is called an "offset gate (OG)." The transfer of signal electrons and the number of saturated electrons at the gate electrode 73 which is the horizontal final stage and the gate electrode 72 are determined by the voltage applied to the gate electrode 74. The p-type region 65 is selectively formed in contact with a p-type well 2 on the surface side of the p-type well 2 formed in the substrate 1.

The n-type region 69 is formed on the surface of the substrate 1 so as to contact the gate insulating film 7. The p-type region 66 is formed so as to be interposed between the p-type region 65 on the depth side of the substrate 1 and the n-type region 69 on the surface side of the substrate 1. The p-type region 67 is formed so as to be interposed between the p-type region 65 on the depth side of the substrate 1 and the n-type region 69 on the surface side of the substrate 1.

The p-type region 68 having a lower concentration than the p-type region 66 and p-type region 67 is surrounded by the p-type region 65 on the depth side of the substrate 1, by the n-type region 69 on the surface side of the substrate 1, by the p-type region 66 on one end and by the p-type region 67 on the other end, and formed ranging from the gate electrode 71, gate electrode 72, gate electrode 73 and gate electrode 74. Forming the p-type region 68 having a lower concentration than the p-type region 66 and p-type region 67 in the depth of the substrate 1, in contact with the n-type region 69 makes it possible to further extend a depletion layer from the n-type region 69 to the p-type region 68, extend the depletion layer in the p-type region 68 more than the p-type region 66 and p-type region 67 and thereby increase the potential amplitude at the time of transfer. Furthermore, since the p-type region 68 is formed ranging from the gate electrode 71, gate electrode 72, gate electrode 73 and gate electrode 74, it is possible to suppress local and drastic variations of the potential right below the gate electrode 71, gate electrode 72, gate electrode 73, gate electrode 74 at the time of transfer and keep the potential variation smooth over the entire transfer channel thereby increasing the electric field strength at the time of transfer to improve the transfer of signal electrons in the region 62 which is the horizontal outlet.

The horizontal CCD is constructed of the n-type region 69, the p-type region 66, the p-type region 68, a p-type region 16, the p-type region 75, the p-type region 76 and the p-type region 77. The gate electrode 15 for controlling discharge of signal electrons is formed next to the gate electrode 74. The n-type region 20 which is the reset drain is formed in contact with the n-type region 69 right below the gate electrode 15. The region 64 including the gate electrode 15 and n-type region 20 is the reset drain section. The AL wiring 23 is connected to the contact 21 formed on the n-type region 69 on the surface of the substrate 1, penetrating through the insulating film 22 and gate insulating film 7 between an end of the gate electrode 74 not adjoining the gate electrode 73 and an end of the gate electrode 15 not adjoining the n-type region 20. The region 63 between the end of the gate electrode 74 not adjoining the gate electrode 73 and the end of the gate electrode 15 not adjoining the n-type region 20 is the signal electron-voltage conversion section.

In FIG. 7, the gate electrode 71 and gate electrode 73 are formed on the gate insulating film 7 selectively formed in contact with the substrate 1. The gate electrode 72 is formed on the gate insulating film 7 so as to adjoin the gate electrode 71 and gate electrode 73 through the insulating film 22. The gate electrode 70 is formed on the gate insulating film 7 so as to adjoin the end of the gate electrode 71 not adjoining the gate electrode 72 through the insulating film 22. The gate electrode 74 is formed on the gate insulating film 7 so as to adjoin the end of the gate electrode 73 not adjoining the gate electrode 72 through the insulating film 22.

The n-type region 69 is formed on the surface of the substrate 1. The p-type region 66 is formed in the depth of the substrate 1, in contact with the n-type region 69. The p-type region 67 is formed in the depth of the substrate 1, in contact with the n-type region 69. The p-type region 68 having a lower concentration than the p-type region 66 and p-type region 67 is formed with one end contacting the p-type region 66 and the other end contacting the p-type region 67, in the depth of the substrate 1, in contact with the n-type region 69, ranging from the gate electrode 71 to the gate electrode 72, gate electrode 73 and gate electrode 74. Adopting such a configuration makes it possible to suppress local and drastic variations of the potential right below the gate electrode 71, gate electrode 72, gate electrode 73 and gate electrode 74 at the time of transfer and keep the potential variation smooth over the entire transfer channel, thereby manufacturing a solid state image sensor capable of improving the transfer of signal electrons at the horizontal outlet.

Next, the mechanism capable of improving the transfer of signal electrons at the horizontal final stage and increasing the number of saturated electrons will be explained using FIG. 7 and FIG. 8.

Figure 8:
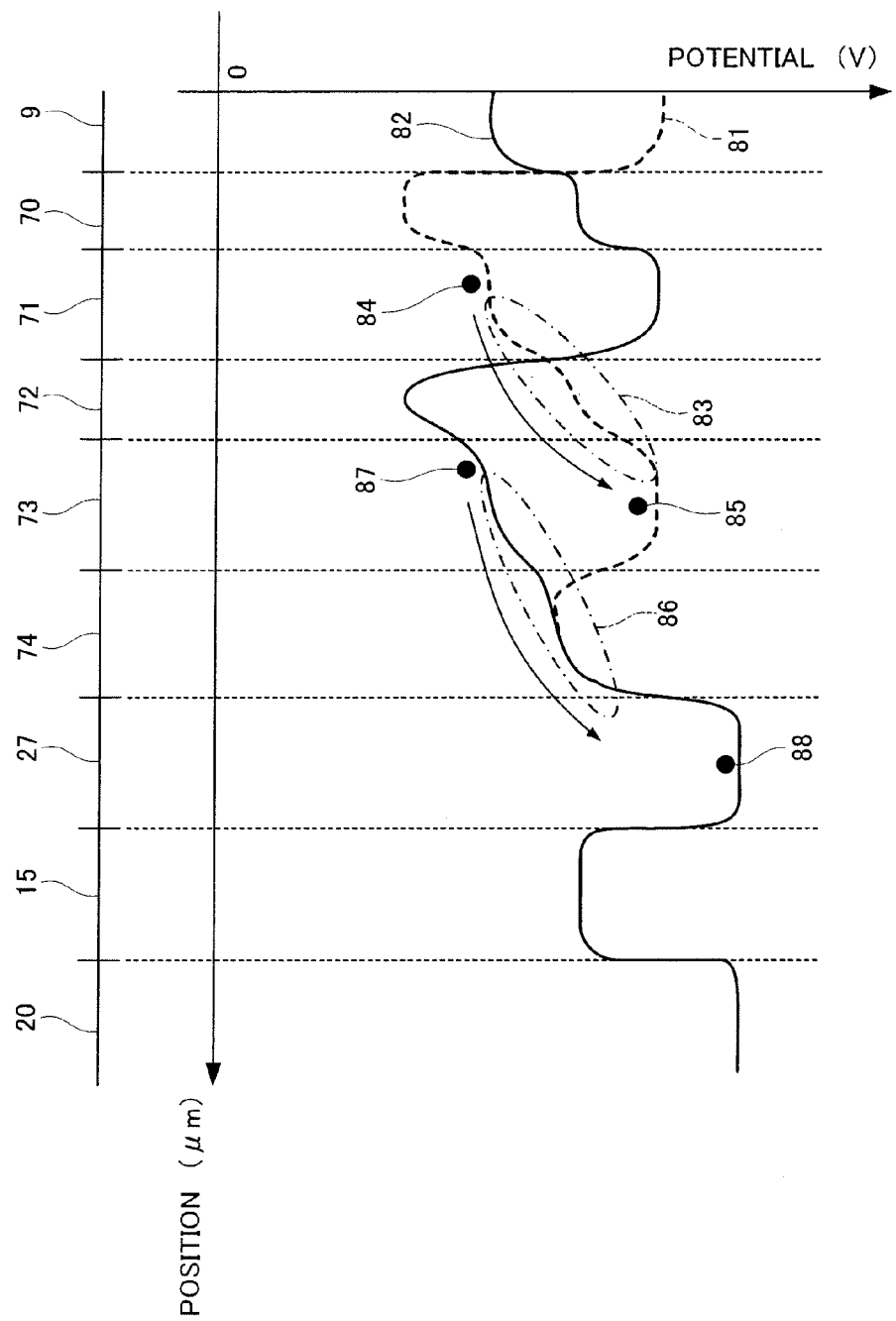
FIG. 8 shows a depletion potential at the time of charge transfer in the horizontal CCD channel of the solid state image sensor according to Embodiment 3.

FIG. 8 is a depletion potential at the time of transfer in the n-type region 69 which is the horizontal CCD channel in the direction 61 parallel to the charge transfer direction including the gate electrode 73 which is the horizontal CCD final stage, the gate electrode 74 which is the offset gate, region 63, gate electrode 15 which is the offset gate and the n-type region 20 which is the reset drain. A dotted line 81 indicates a potential distribution when signal electrons are transferred from below the gate electrode 71 immediately preceding the horizontal final stage to below the gate electrode 73 which is the final stage. A chain line 83 indicates a transfer potential distribution below the gate electrode 71, gate electrode 72 and gate electrode 73. An electron 84 is a signal electron below the gate electrode 71 before a transfer and is a signal electron below the gate electrode 73 after transfer. A solid line 82 indicates a potential distribution when signal electrons are transferred from below the gate electrode 73 which is the final stage to the region 63 which is the signal electron conversion section. A chain line 86 indicates a transfer potential distribution below the gate electrode 73 and gate electrode 74. An electron 87 is a signal electron below the gate electrode 73 before a transfer and an electron 88 is a signal electron of the region 63 after a transfer. Reference numerals 9, 15 and 20 in the partitioned regions indicate reference numerals of the components shown in FIG. 6 and FIG. 7. Reference numerals 70 to 74, 63 in the partitioned regions indicate the reference numerals of the components shown in FIG. 6 and FIG. 7. In FIG. 7, the p-type region 68 is formed in the horizontal CCD, ranging from right below the gate electrode 71 immediately preceding the horizontal final stage which is longer than the gate electrode at the horizontal repetition section and where transfer deterioration is predicted to occur to the gate electrode 72, gate electrode 73 which is the final stage and gate electrode 74 which is the offset gate. This Embodiment 3 adopts a structure causing the p-type region 68 to produce variations of the depletion layer in the horizontal CCD right below the gate electrode 71, gate electrode 72, gate electrode 73 and gate electrode 74 at the time of transfer, thereby increasing the potential amplitude at the time of transfer and enhancing the transfer electric field.

In FIG. 8, at the time of transfer from below the gate electrode 71 immediately preceding the horizontal final stage to the gate electrode 73 of the horizontal final stage, the potential distribution is as shown by the dotted line 81. Since the p-type region 68 having a lower concentration than the p-type region 66 and p-type region 67 is formed in the depth of the substrate, in contact with the n-type region 69, it is possible to increase the potential amplitude at the time of transfer. Furthermore, since the p-type region 68 is formed ranging from below the gate electrode 71 to the gate electrode 72 and gate electrode 73, it is possible to suppress local and drastic variations of the potential right below the gate electrode 71, gate electrode 72 and gate electrode 73 at the time of transfer, thereby smooth the transfer potential in the CCD below the gate electrode 71, gate electrode 72 and gate electrode 73 shown by the chain line 83 and average the potential gradient. Therefore, it is possible to eliminate the potential flat part below the gate electrode 71 and gate electrode 72 and strengthen the signal transfer electric field from below the gate electrode 71 to below the gate electrode 73.

Furthermore, at the time of transfer from below the gate electrode 73 of the horizontal final stage to the region 63, the potential distribution is as shown by the solid line 82. Since the p-type region 68 having a lower concentration than the p-type region 66 and p-type region 67 is formed below the gate electrode 73 and gate electrode 74, it is possible to suppress local and drastic variations of the potential at the time of transfer right below the gate electrode 73 and gate electrode 74, thereby smooth the transfer potential within the CCD below the gate electrode 73 and gate electrode 74 shown by the chain line 86 and average the potential gradient. This can eliminate the potential flat part below the gate electrode 71 and gate electrode 72 and strengthen the signal transfer electric field from below the gate electrode 73 to the region 63.

Therefore, the transfer of signal electrons at the horizontal outlet can be improved. The p-type region 68 is formed for the purpose of strengthening the transfer electric field, and therefore the p-type region 68 is formed from the gate electrode 71 to the gate electrode 74 in this embodiment, but a structure in which the p-type region 68 is formed below a plurality of gate electrodes at the horizontal outlet may also be adopted.

As described above, according to this Embodiment 3, it is possible to manufacture a solid state image sensor including a first insulating film selectively formed in contact with a semiconductor substrate, a second insulating film formed in contact with and on the first insulating film, first and second gate electrodes formed on the first insulating film, a third gate electrode formed on the first insulating film so as to adjoin the first and second gate electrodes through the second insulating film, a fourth gate electrode formed on the first insulating film so as to adjoin an end of the first gate electrode not adjoining the third gate electrode through the second insulating film, a fifth gate electrode formed on the first insulating film so as to adjoin an end of the second gate electrode not adjoining the third gate electrode through the second insulating film, a first n-type diffusion layer formed on the surface of the semiconductor substrate, a first p-type diffusion layer formed in the depth of the semiconductor substrate, in contact with the first n-type diffusion layer, a second p-type diffusion layer formed in the depth of the semiconductor substrate, in contact with the first n-type diffusion layer, and a third p-type diffusion layer, one end of which adjoins the first p-type diffusion layer, having a lower concentration than the first and second p-type diffusion layers, the other end of which adjoins the second p-type diffusion layer, formed in the depth of the semiconductor substrate, in contact with the first n-type diffusion layer, ranging from the first to third, second and fifth gate electrodes, and thus capable of improving the transfer efficiency at a horizontal outlet.

Embodiment 4

The structure of a solid state image sensor according to Embodiment 4 will be explained using FIG. 9 and FIG. 10.

Figure 9:
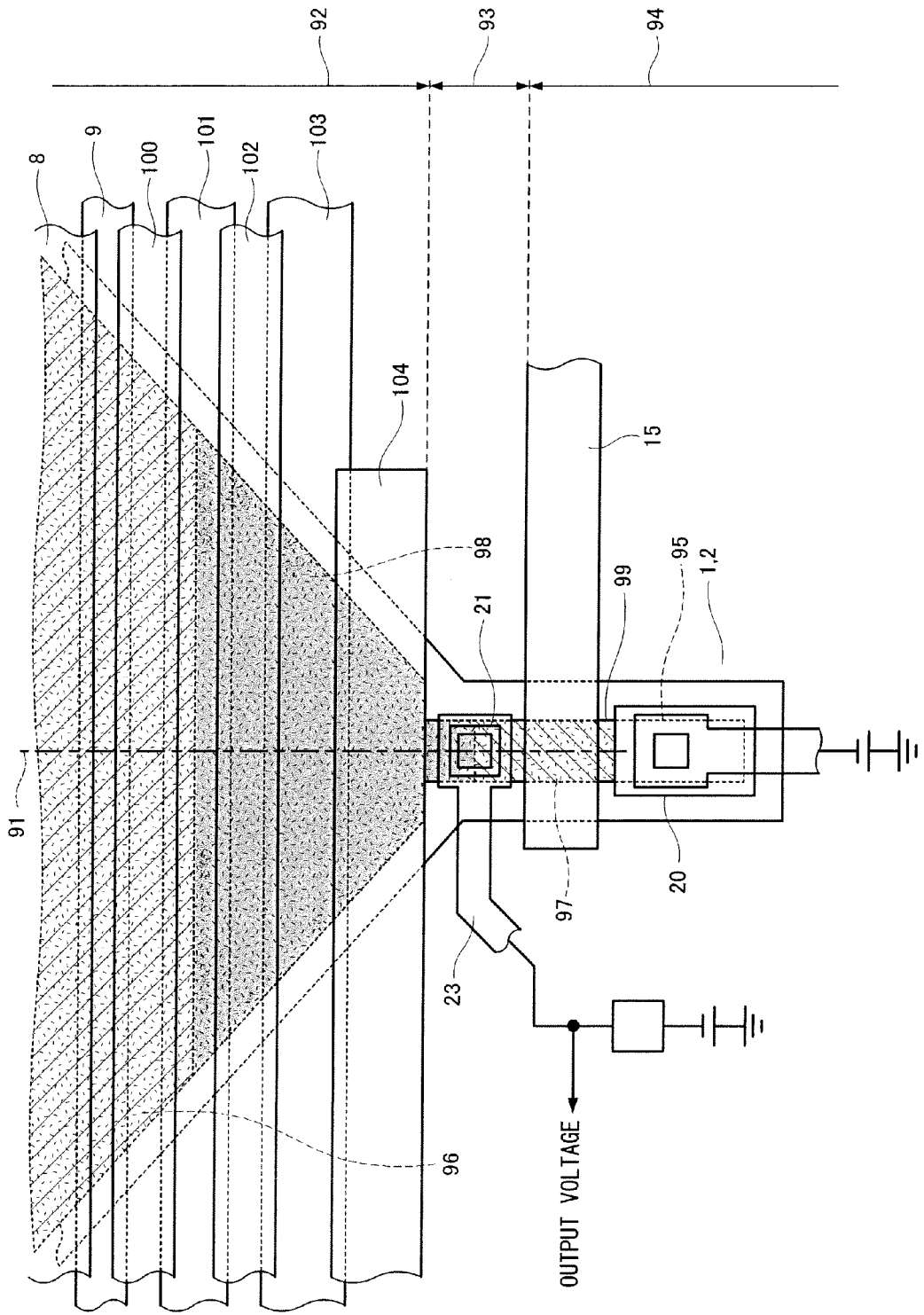
FIG. 9 is a schematic plan view of a horizontal CCD outlet of a solid state image sensor according to Embodiment 4.

FIG. 9 shows a schematic plan view of a horizontal CCD outlet of the solid state image sensor according to Embodiment 4 of the present invention. FIG. 10 shows a schematic cross-sectional view of the horizontal CCD outlet of the solid state image sensor according to Embodiment 4, which is a cross section in a direction 91 parallel to a charge transfer direction, including a gate electrode 103 which is a horizontal CCD final stage, a gate electrode 104 which is an offset gate, a region 93, a gate electrode 15 which is a reset gate and an n-type region 20 which is a reset drain. The configuration will be explained using FIG. 9 and FIG. 10. However, the same reference numerals as those in FIG. 1 and FIG. 2, and FIG. 6, FIG. 7 indicate identical parts and explanations thereof will be omitted here.

In FIG. 9, a region 92 including a gate electrode 8, a gate electrode 9, a gate electrode 100, a gate electrode 101, a gate electrode 102, the gate electrode 103 and the gate electrode 104 formed above an n-type region 99, a p-type region 95, a p-type region 96 and a p-type region 98 is the horizontal CCD outlet that sends signal electrons from a horizontal CCD to a voltage conversion section. A region 94 including the n-type region 99, the p-type region 95, a p-type region 97, the n-type region 20 and the gate electrode 15 formed above the n-type region 99 is a reset drain section that discharges signal electrons from the voltage conversion section. The region 93 interposed between the region 92 and region 94 is a signal electron-voltage conversion section. The region 93 is constructed of the n-type region 99, the p-type region 95, the p-type region 97, a contact 21 and AL wiring 23. The p-type region 95, p-type region 96 and p-type region 98 of the region 92 which is the horizontal outlet are configured into a trapezoidal shape narrowed down toward the region 93 which is the signal electron-voltage conversion section.

Figure 10:
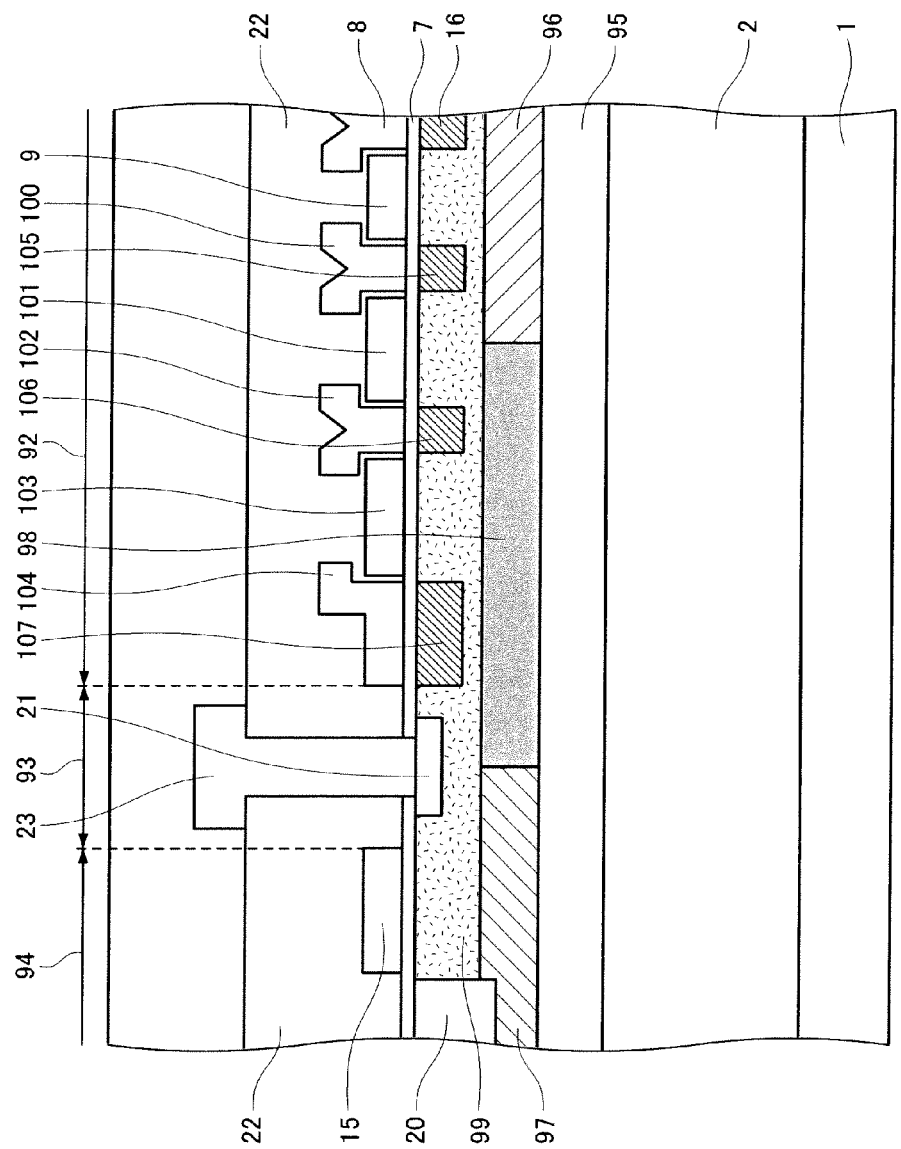
FIG. 10 is a schematic cross-sectional view of the horizontal CCD outlet of the solid state image sensor according to Embodiment 4.

In FIG. 10, the gate electrode 101 and gate electrode 103 are formed through a gate insulating film 7 formed, in contact with the surface of an n-type semiconductor substrate 1. The gate electrode 101 and gate electrode 103 function as storage gates for accumulating signal electrons at the time of transfer at the horizontal CCD. Especially, the gate electrode 103 is a gate electrode at the final stage of the horizontal CCD. Since the p-type region 95, p-type region 96, p-type region 98 of the region 92 which is the horizontal CCD outlet are configured narrowed down toward the region 93, gate electrodes closer to the region 93 have longer electrodes to secure the number of saturated electrons at each storage gate of the horizontal outlet. There is a relationship as follows: gate length in horizontal repetition section<gate length of electrode 9<gate length of electrode 101<gate length of electrode 103. The gate electrode 100 is formed on the gate insulating film 7 so as to adjoin the gate electrode 9 and the gate electrode 101 through an insulating film 22. The gate electrode 102 is formed on the gate insulating film 7 so as to adjoin the gate electrode 101 and the gate electrode 103 through the insulating film 22. The gate electrode 104 is formed on the gate insulating film 7 so as to adjoin an end of the gate electrode 103 not adjoining the gate electrode 102 through the insulating film 22. In the n-type region 99, there are formed a p-type region 105 right below the gate electrode 100, a p-type region 106 right below the gate electrode 102 and a p-type region 107 right below the gate electrode 104 on the surface of the substrate 1 respectively. Providing the p-type region 105 right below the gate electrode 100 and p-type region 106 right below the gate electrode 102 respectively allows these gate electrodes to function as barrier gates for suppressing backflow of signal electrons when transferring signals through the horizontal CCD using two-phase driving and promoting the transfer. The gate electrode 104 is located at the end of the region 92 which is the horizontal outlet and is called an "offset gate (OG)." The transfer of signal electrons and the number of saturated electrons at the gate electrode 103 which is the horizontal final stage and the gate electrode 102 are determined by the voltage applied to the gate electrode 104. The p-type region 95 is selectively formed on the surface side of a p-type well 2 formed in the substrate 1, in contact with the p-type well 2. The n-type region 99 is formed on the surface of the substrate 1 so as to contact the gate insulating film 7. The p-type region 96 is formed so as to be interposed between the p-type region 95 on the depth side of the substrate 1 and the n-type region 99 on the surface side of the substrate 1. The p-type region 97 is formed so as to be interposed between the p-type region 95 on the depth side of the substrate 1 and the n-type region 99 on the surface side of the substrate 1. The p-type region 98 having a lower impurity concentration than the p-type region 96 and p-type region 97 is surrounded by the p-type region 95 on the depth side of the substrate 1, by the n-type region 99 on the surface side of the substrate 1, by the p-type region 96 at one end of the p-type region 98 and by the p-type region 97 at the other end, and formed ranging from the gate electrode 101 to the gate electrode 102, gate electrode 103 and gate electrode 104 and extending beyond the gate electrode 104 to the region 93. The horizontal CCD is constructed of the n-type region 99, p-type region 96, p-type region 98, p-type region 16, p-type region 105, p-type region 106 and p-type region 107. Forming the p-type region 98 with a lower impurity concentration than the p-type region 96 and p-type region 97 makes it possible to enhance the electric field strength at the time of transfer and improve the transfer of signal electrons in the region 92 which is the horizontal outlet. Since the mechanism capable of improving the transfer is the same as the aforementioned Embodiment 3, explanations thereof will be omitted. Furthermore, since the p-type region 98 is formed extending beyond the gate electrode 104 to the region 93, it is possible to keep the low p-type impurity concentration right below the n-type region 99 below the gate electrode 104 on the boundary with the region 93 to a low concentration and thereby maintain the potential right below the gate electrode 102 at the time of transfer in a smooth condition. Thus, the potential below the gate electrode 104, which is the offset gate, is less likely to be affected than when the end of the p-type region 98 exists below the gate electrode 104, even if the impurity concentration of the p-type region 98 varies. Therefore, since the potential in the horizontal CCD right below the gate electrode 104 at the end of the horizontal outlet can be formed stably, transfer variations can be suppressed.

In FIG. 10, the gate electrode 101 and gate electrode 103 are respectively formed on the selectively formed gate insulating film 7, in contact with the substrate 1. The gate electrode 102 is formed on the gate insulating film 7 so as to adjoin the gate electrode 101 and gate electrode 103 through the insulating film 22. The gate electrode 100 is formed on the gate insulating film 7 so as to adjoin an end of the gate electrode 101 not adjoining the gate electrode 102 through the insulating film 22. The gate electrode 104 is formed on the gate insulating film 7 so as to adjoin an end of the gate electrode 103 not adjoining the gate electrode 102 through the insulating film 22. The n-type region 99 is formed on the surface of the substrate 1. The p-type region 96 is formed in the depth of the substrate 1, in contact with the n-type region 99. The p-type region 97 is formed in the depth of the substrate 1, in contact with the n-type region 99. The p-type region 98 having a lower concentration than the p-type region 96 and p-type region 97 is formed, with one end of the p-type region 98 in contact with the p-type region 96 and the other end in contact with the p-type region 97, in the depth of the substrate 1, in contact with the n-type region 99, ranging from right below the gate electrode 101 to right below the gate electrode 102, gate electrode 103 and gate electrode 104 and extending beyond the gate electrode 104 to the region 93 which is the signal electron-voltage conversion section. As shown above, the transfer of signal electrons at the horizontal outlet can be improved.

As described above, according to Embodiment 4, it is possible to manufacture a solid state image sensor including a first insulating film selectively formed in contact with a semiconductor substrate, a second insulating film formed in contact with and on the first insulating film, first and second gate electrodes formed on the first insulating film, a third gate electrode formed on the first insulating film so as to adjoin the first and second gate electrodes through the second insulating film, a fourth gate electrode formed on the first insulating film so as to adjoin an end of the first gate electrode not adjoining the third gate electrode through the second insulating film, a fifth gate electrode formed on the second insulating film so as to adjoin an end of the second gate electrode not adjoining the third gate electrode through the second insulating film, a first n-type diffusion layer formed on the surface of the semiconductor substrate, a first p-type diffusion layer formed in the depth of the semiconductor substrate, in contact with the first n-type diffusion layer, a second p-type diffusion layer formed in the depth of the semiconductor substrate, in contact with the first n-type diffusion layer, and a third p-type diffusion layer having a lower concentration than the first and second p-type diffusion layers, with one end of the third p-type diffusion layer in contact with the first p-type diffusion layer and the other end in contact with the second p-type diffusion layer, formed in the depth of the semiconductor substrate, in contact with the first n-type diffusion layer, ranging from right below the first gate electrode to the third, second and fifth gate electrodes and extending beyond the fifth gate electrode to the signal electron-voltage conversion section, and thus capable of improving the transfer efficiency at a horizontal outlet.

Embodiment 5

The structure of a solid state image sensor according to Embodiment 5 will be explained using FIG. 11, FIG. 12, FIG. 13 and FIG. 14.

Figure 11:
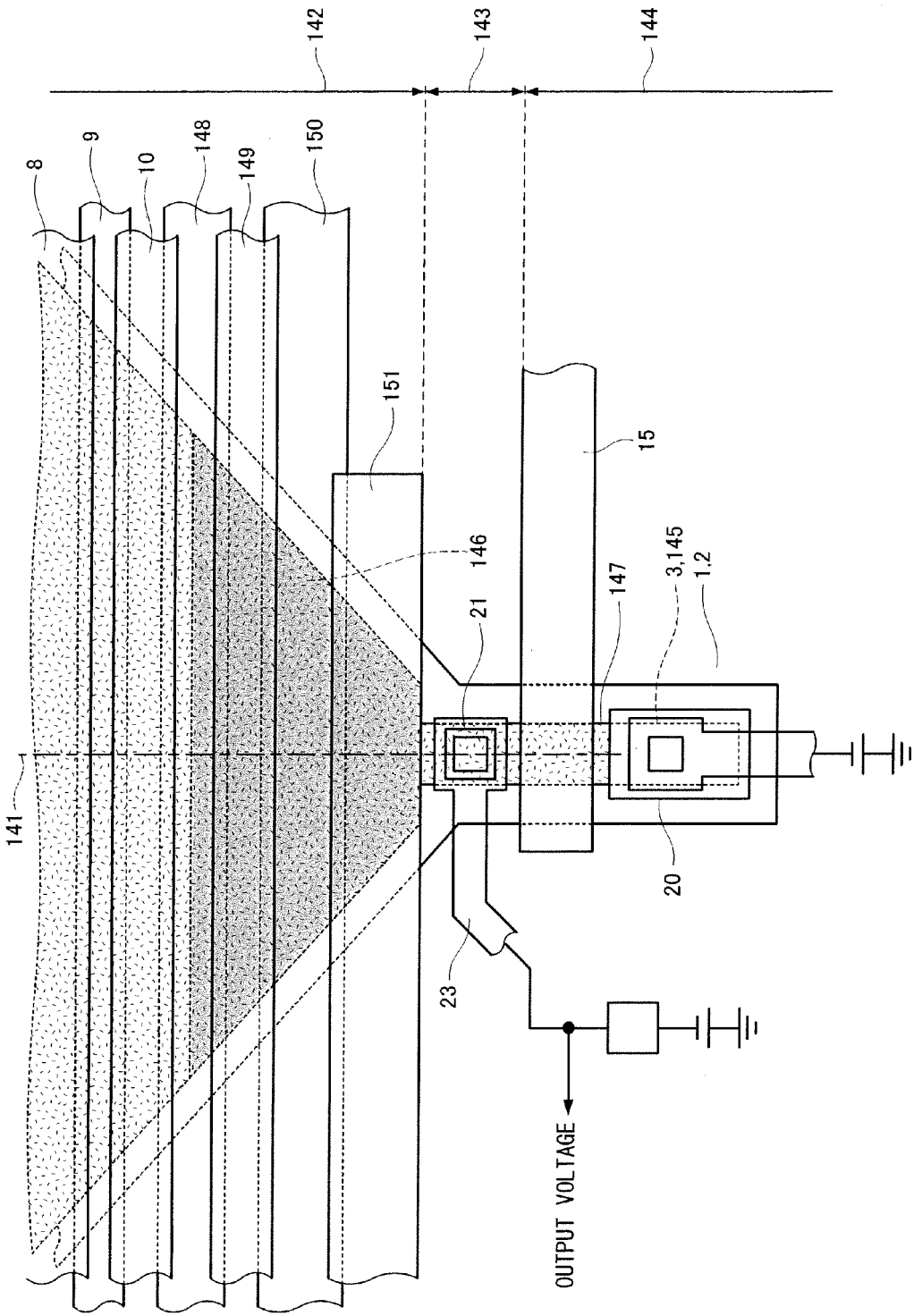
FIG. 11 is a schematic plan view of a horizontal CCD outlet of a solid state image sensor according to Embodiment 6.
Figure 12:
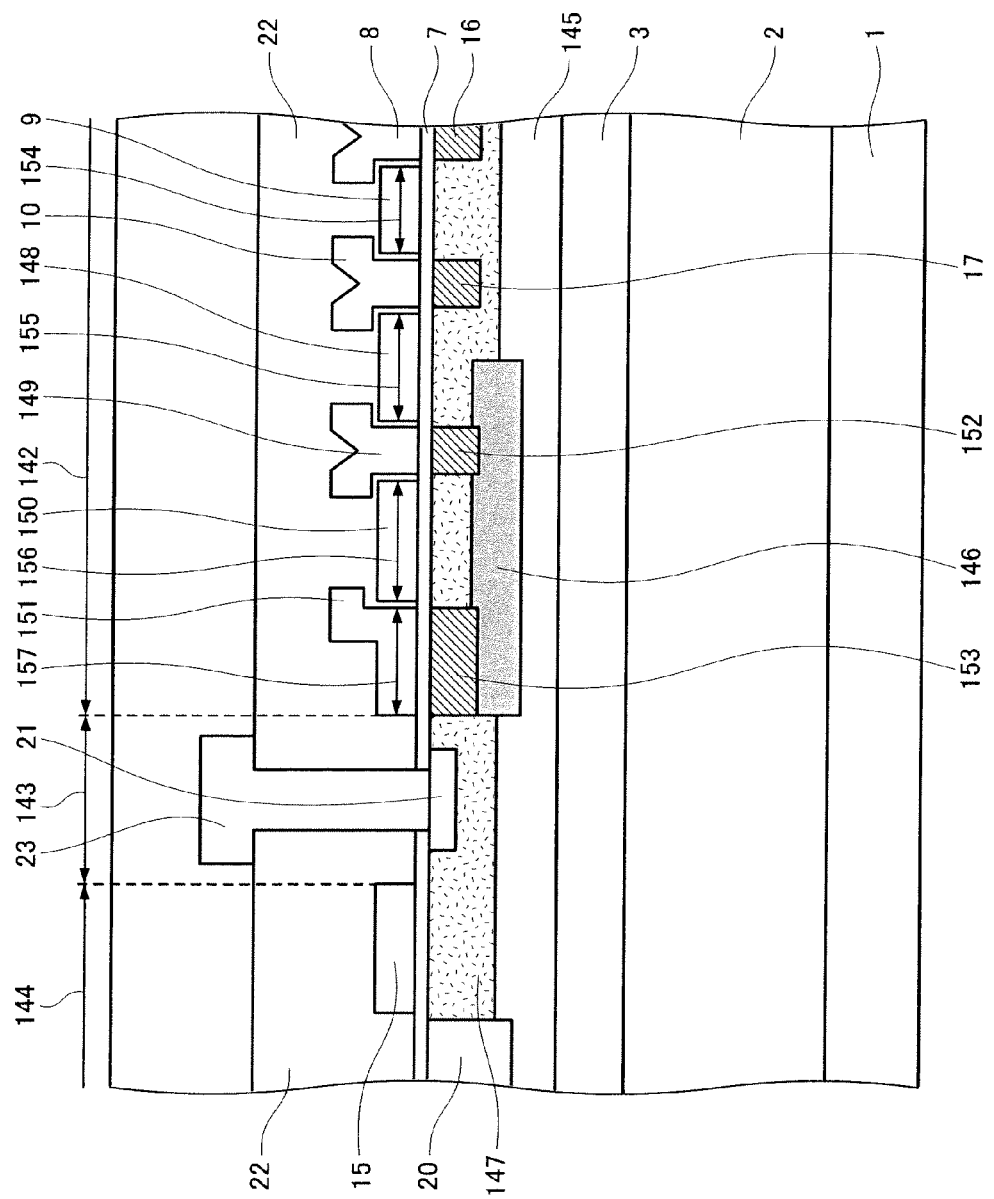
FIG. 12 is a schematic cross-sectional view of a horizontal CCD outlet of a solid state image sensor according to Embodiment 5.
Figure 13:
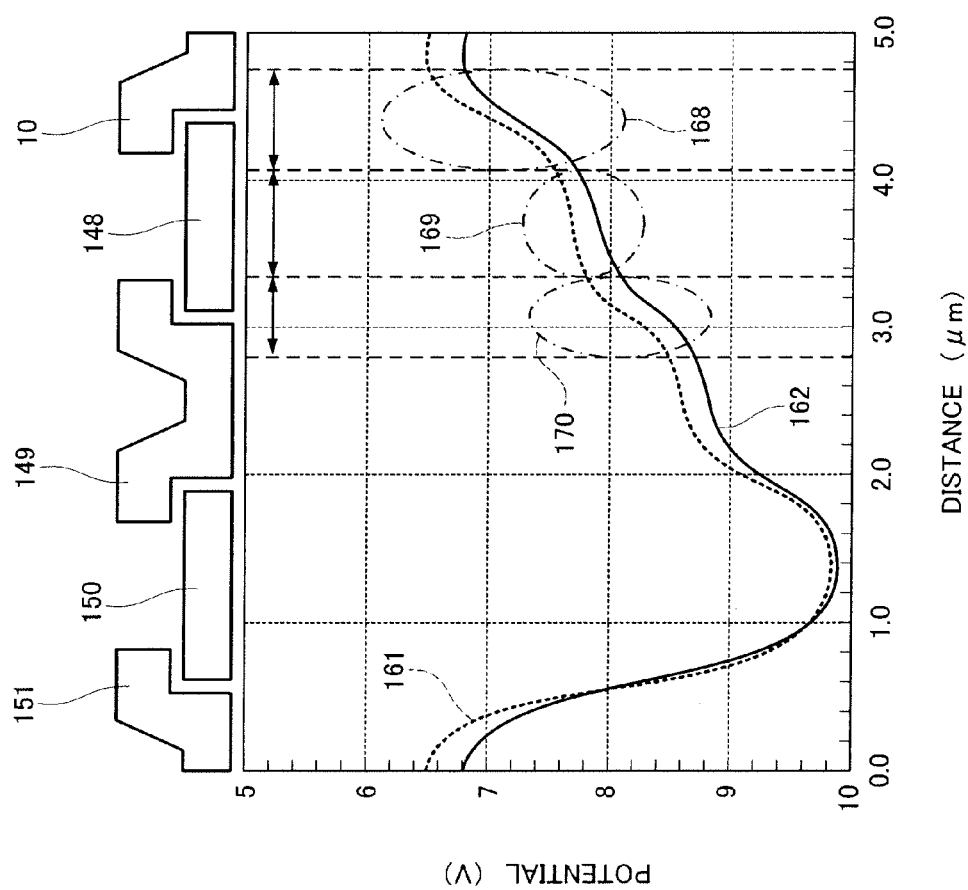
FIG. 13 shows a simulation result of the depletion potential at the time of charge transfer in the horizontal CCD channel.
Figure 14:
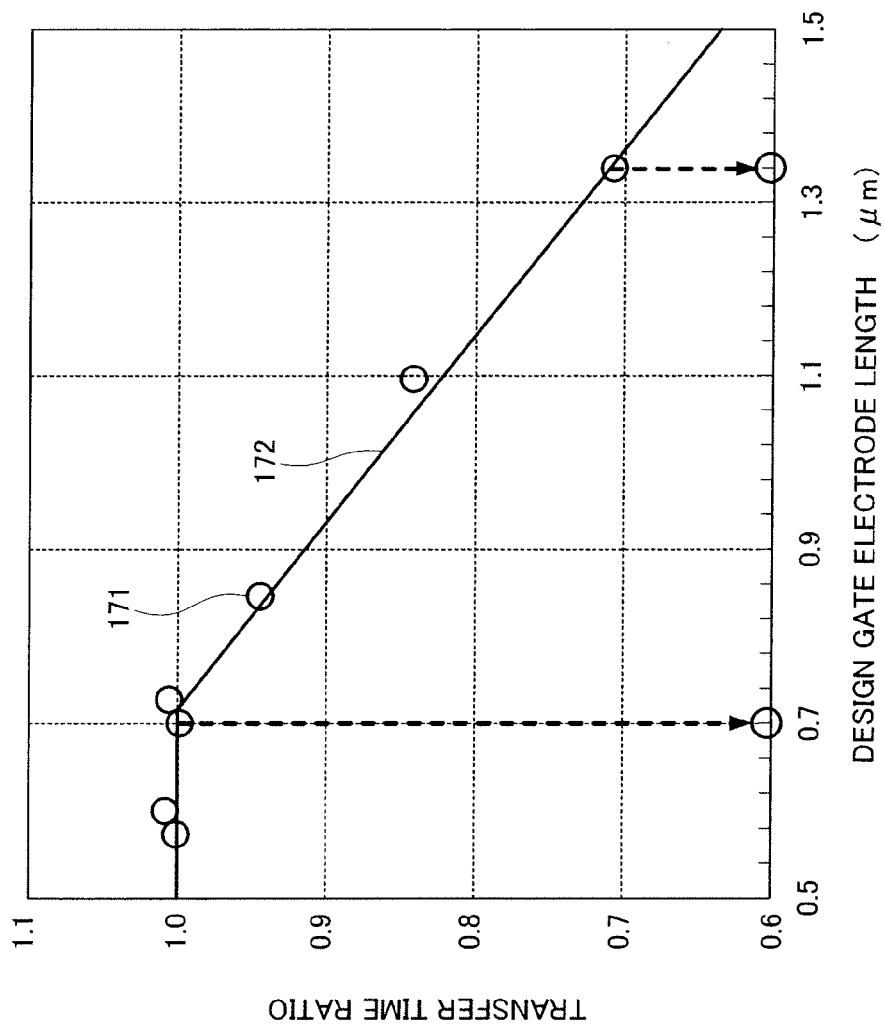
FIG. 14 shows the relationship between transfer gate electrode length and transfer time ratio.

FIG. 11 shows a schematic plan view of a horizontal CCD outlet of the solid state image sensor according to Embodiment 5 of the present invention. FIG. 12 shows a schematic cross-sectional view of the horizontal CCD outlet of the solid state image sensor according to Embodiment 5, which is a cross section in a direction 141 parallel to a charge transfer direction, including a gate electrode 149 which is a horizontal CCD final stage, a gate electrode 150 which is an offset gate, a region 143, a gate electrode 15 which is a reset gate and an n-type region 20 which is a reset drain. FIG. 13 shows a simulation result of the depletion potential in a horizontal CCD channel at the time of charge transfer and FIG. 14 shows a relationship between a transfer gate electrode length and transfer time ratio.

The configuration will be explained using FIG. 11 and FIG. 12. However, the same reference numerals as those in FIG. 1 and FIG. 2 indicate identical parts and explanations thereof will be omitted here.

In FIG. 11, a region 142 including a gate electrode 8, a gate electrode 9, a gate electrode 10, a gate electrode 148, the gate electrode 149, the gate electrode 150 and a gate electrode 151 formed above an n-type region 146, an n-type region 147, a p-type region 3 and a p-type region 145 is the horizontal CCD outlet that sends signal electrons from a horizontal CCD to a voltage conversion section. A region 144 including the n-type region 147, n-type region 20 and gate electrode 15 formed above the n-type region 147 is a reset drain section that discharges signal electrons from the voltage conversion section. The region 143 interposed between the region 142 and region 144 is a signal electron-voltage conversion section. The region 143 is constructed of the n-type region 146, n-type region 147, p-type region 3, p-type region 145, a contact 21 and AL wiring 23. The n-type region 146 of the region 142 which is the horizontal outlet, n-type region 147 and p-type region 145 are configured into a trapezoidal shape narrowed down toward the region 143 which is the signal electron-voltage conversion section. The n-type region 146 is formed into a trapezoidal shape in the region 142 such that one end of the n-type region 146 forms a long side below the gate electrode 148, the other end thereof forms a short side and matches an end of the gate electrode 151 on the region 143 side below the gate electrode 151 and the other sides match the narrowed sides of the n-type region 147, p-type region 3 and p-type region 145. The region 142, region 143 and region 144 are partitioned in a direction perpendicular to the direction 141 parallel to the charge transfer direction.

In FIG. 12, the p-type region 145 is formed in contact with the p-type region 3 selectively formed in the semiconductor substrate 1 on the p-type region 3 on the surface side of the substrate 1. The n-type region 147 is formed in contact with the p-type region 145 on the surface of the substrate 1. A gate insulating film 7 is formed on the surface of the n-type region 147 on the substrate 1. The gate electrode 9, gate electrode 148 and gate electrode 150 are respectively formed through the gate insulating film 7. The gate electrode 9, gate electrode 148 and gate electrode 150 function as storage gates for accumulating signal electrons in the horizontal CCD at the time of transfer. Especially, the gate electrode 150 is a gate electrode which is the final stage of the horizontal CCD. Since the n-type region 146 of the region 142 which is the horizontal CCD outlet, n-type region 147 and p-type region 145 are configured into a trapezoidal shape narrowed down toward the region 143, gate electrodes closer to the region 143 have longer electrodes to secure the number of saturated electrons at each storage gate of the horizontal outlet. There is a relationship as follows: gate length in horizontal repetition section<gate length 154 of electrode 9<gate length 155 of electrode 148<gate length 156 of electrode 150.

The gate electrode 10 is formed on the gate insulating film 7 so as to adjoin the gate electrode 9 and the gate electrode 148 through the insulating film 22. The gate electrode 149 is formed on the gate insulating film 7 so as to adjoin the gate electrode 148 and the gate electrode 150 through the insulating film 22. The gate electrode 151 is formed on the gate insulating film 7 so as to adjoin an end of the gate electrode 150 not adjoining the gate electrode 149 through the insulating film 22. The gate electrode 8 is formed on the gate insulating film 7 so as to adjoin an end of the gate electrode 9 not adjoining the gate electrode 10 through the insulating film 22. In the n-type region 147, there are formed a p-type region 16 right below the gate electrode 8, a p-type region 17 right below the gate electrode 10, a p-type region 152 right below the gate electrode 149 and a p-type region 153 right below the gate electrode 151 on the surface of the substrate 1 respectively. Providing the p-type region 16 right below the gate electrode 8, p-type region 17 right below the gate electrode 10 and p-type region 152 right below the gate electrode 149 respectively allows these gate electrodes to function as barrier gates for suppressing backflow of signal electrons when transferring signals in the horizontal CCD using two-phase driving, promoting the transfer and determining the size of a potential well for accumulating electrons. Furthermore, suppose the gate electrode length of the gate electrode 151 and any number of storage gates close to the region 143; the gate electrode 148 and gate electrode 150 in this embodiment, is 0.7 μm or more.

In the substrate 1, the n-type region 146 having a lower impurity concentration than the n-type region 147 is surrounded by the p-type region 145 on the depth side of the substrate and by the n-type region 147 on the surface side thereof, and formed ranging from right below the gate electrode 148 to right below the gate electrode 149, gate electrode 150, gate electrode 151 so as to be formed right below all the gate electrodes having a gate electrode length of 0.70 μm or more. The gate electrodes having a gate electrode length of 0.70 µm or more mainly correspond to OG gates susceptible to potential modulation from the region 143 which is the storage electrode and the signal electron-voltage conversion section to secure saturated electrons. Here the horizontal CCD is constructed of the n-type region 146, n-type region 147, p-type region 145, p-type region 16, p-type region 17, p-type region 152 and p-type region 153. Forming the n-type region 146 with a lower concentration than the n-type region 147 makes it possible to enhance the electric field strength at the time of transfer, also increase the n-type concentration in the horizontal CCD, thereby improve the transfer of signal electrons in the region 142 which is the horizontal outlet and also increase the number of saturated electrons.

Since the mechanism capable of increasing the number of saturated electrons in the horizontal outlet is the same as the aforementioned Embodiment 1, explanations thereof will be omitted. The mechanism whereby the transfer efficiency can be improved by forming the n-type region 146 having a lower impurity concentration than the n-type region 147 below the gate electrodes having a gate electrode length of 0.70 µm or more will be explained using FIG. 13 and FIG. 14.

In FIG. 13, a solid line 162 is a potential distribution in a two-dimensional simulation when signal electrons are transferred from the gate electrode 148 to the gate electrode 150 in the horizontal CCD of this embodiment. The n-type region 146 is formed right below all the gate electrodes; gate electrode 10, gate electrode 148, gate electrode 149, gate electrode 150 and gate electrode 151. The gate electrode length of the gate electrode 150 and gate electrode 148, which become storages is 1.40 µm, and the gate electrode length of the gate electrode 10, gate electrode 149 and gate electrode 151 which become barriers is 1.10 µm. At the time of transfer, 3.0 V is applied to the gate electrode 148 and gate electrode 150 and 0.0 V is applied to the gate electrode 10, gate electrode 149 and gate electrode 151 respectively. A dotted line 161 is a potential distribution in a two-dimensional simulation at the time of transfer with the same gate length in the conventional example. A chain line section 169 shows a region where the potential gradient right below the gate electrode 148 becomes flat. A chain line section 168 shows a region where the potential gradient right below the neighborhood of the boundary between the gate electrode 10 and the gate electrode 148 drastically changes. A chain line section 170 is a region where the potential gradient right below the neighborhood of the boundary between the gate electrode 149 and gate electrode 148 drastically changes. The chain line section 168, chain line section 169 and chain line section 170 are regions common to Embodiment 5 and the conventional example. FIG. 14 is a graph of the transfer time ratio of signal electrons from the gate electrode 148 to the gate electrode 150 obtained through a two-dimensional simulation when the design gate electrode lengths of the gate electrode 148 and gate electrode 150 are changed assuming that the gate electrode length ratio of the gate electrode 10, gate electrode 148, gate electrode 149, gate electrode 150 and gate electrode 151 in FIG. 13 is constant. The transfer time ratio is a transfer time in Embodiment 5/transfer time in the conventional example, a circle mark 171 shows the simulation result, a solid line 172 shows a correlation between the transfer gate electrode length and transfer time ratio of the gate electrode 148 and gate electrode 150.

From the simulation result in FIG. 13, the potential distribution in Embodiment 6 at the time of transfer of signal electrons from the gate electrode 148 to the gate electrode 150 when the design gate electrode length=1.40 µm is as shown by the dotted line 161. Since different potentials are applied to the gate electrode 148 and gate electrode 149 at the time of transfer, a region having a steep potential gradient is formed in the chain line section 170 between the gate electrode 148 and gate electrode 149. Furthermore, since the p-type region 17 formed right below the gate electrode 10 functions as a barrier, a region of a steep potential gradient is formed in the chain line section 168 between the gate electrode 10 and the gate electrode 148. However, since the impurity concentration in the horizontal CCD is high and drastically changes, the region in which the potential gradient changes is narrow and the chain line section 169 interposed between the chain line section 168 and the chain line section 170 has substantially no potential gradient without being affected by any effect of the electric field from the gate electrode having a different potential or effect of the electric field from the p-type region which becomes a barrier. In this Embodiment 6, since the n-type region 146 having a lower impurity concentration than the n-type region 147 is formed right below the gate electrode 10, gate electrode 148, gate electrode 149 and gate electrode 151, a depletion layer is likely to spread in the horizontal CCD right below the gate electrode at the time of transfer and a smooth potential gradient is formed in the chain line section 170 due to the effect of the electric field from the gate electrode 149 having a different potential and effect of the electric field from the p-type region 17 which becomes the barrier. Therefore, the potential distribution of the solid line 162 in Embodiment 5 has stronger electric field strength of the flat part of the electric-potential gradient of the chain line section 169 than the conventional example shown by the dotted line 161.

In FIG. 14, the transfer time ratio when the design gate electrode length=1.40 µm corresponding to the case in FIG. 13 is 0.7, Embodiment 5 can transfer a signal in a shorter time than the conventional example and a transfer improvement effect is observed. The shorter the gate electrode length becomes, the closer to 1 the transfer time ratio becomes and the transfer time ratio becomes 1 when the gate electrode=0.70 µm. Even with the structure in the conventional example, when the gate electrode length is reduced from 1.40 µm, the chain line section 169 which is the region having the flat potential gradient in FIG. 13 is physically reduced and the chain line section 168 and chain line section 170 which are the regions having the steep potential gradient come closer to each other, and therefore the potential in the chain line section 169 is pulled by the chain line section 168 and chain line section 170, a potential gradient is steepened, which improves the electric field strength at the time of transfer. Therefore, according to Embodiment 5, when the electrode length of the design transfer gate electrode is 0.70 µm or more, the effect of strengthening the transfer electric field between the neighboring gate electrodes is weakened and it is possible to display the effect of strengthening the transfer electric field through the formation of the n-type region 146. The explanations in FIG. 13 and FIG. 14 have assumed that the electrode lengths of the gate electrode 10, gate electrode 149 and gate electrode 151 which become barriers have a ratio of 11/14 with respect to the electrode lengths of the gate electrode 148 and gate electrode 150, but since the gate electrode 10, gate electrode 149 and gate electrode 151 that do not contribute to securing of the number of saturated electrons at the horizontal outlet are formed according to the minimum design rule, a greater transfer improvement effect than the explanations in FIG. 13 and FIG. 14 can be expected.

Since the purpose is to strengthen the transfer electric field having a transfer gate electrode length of 0.70 µm or more, the n-type region 146 may be formed only right below the gate electrode 148, gate electrode 150 and gate electrode 151 that function as the storage barriers in Embodiment 5.

Furthermore, since the gate electrode 151 that functions as the OG gate can control the number of saturated electrons and their transfers using the voltage applied, the n-type region 146 may also be formed on only the gate electrode 148 and gate electrode 150 that function as the storage barriers of Embodiment 5.

Furthermore, since the purpose is to strengthen the transfer electric field having a transfer gate electrode length of 0.70 μm or more, the n-type region 146 is formed right below the gate electrode 148, gate electrode 150 and gate electrode 151 that function as the storage barriers in Embodiment 5, but if the transfer gate electrode length is equal to or greater than 0.70 μm, the n-type region may also be formed right below a plurality of gates.

Furthermore, the n-type region 146 can also be extended to the region 143 as in Embodiment 2.

As described above, according to Embodiment 5, it is possible to manufacture a solid state image sensor including a first insulating film selectively formed in contact with a semiconductor substrate, a second insulating film formed in contact with and on the first insulating film, first and second gate electrodes formed on the first insulating film, a third gate electrode formed on the first insulating film so as to adjoin the first and second gate electrodes through the second insulating film, a fourth gate electrode formed on the first insulating film so as to adjoin an end of the first gate electrode not adjoining the third gate electrode through the second insulating film, a fifth gate electrode formed on the first insulating film so as to adjoin an end of the second gate electrode not adjoining the third gate electrode through the second insulating film, a signal electron-voltage conversion section formed adjoining the fifth gate electrode, a first p-type diffusion layer formed on the semiconductor substrate, a first n-type diffusion layer formed on the surface of the semiconductor substrate, in contact with the first p-type diffusion layer, and a second n-type diffusion layer having a lower concentration than the first n-type diffusion layer, the depth side of the semiconductor substrate of which is surrounded by the first p-type diffusion layer, the surface side of which is surrounded by the first n-type diffusion layer, ranging from right below the first gate electrode to right below the third, second and fifth gate electrodes, all the first, third, second and fifth gate electrodes being 0.70 μm or more and, and thus capable of improving the transfer efficiency at a horizontal outlet and increasing the number of saturated electrons.

Embodiment 6

The structure of a solid state image sensor according to Embodiment 6 will be explained using FIG. 15, FIG. 16 and FIG. 17.

Figure 15:
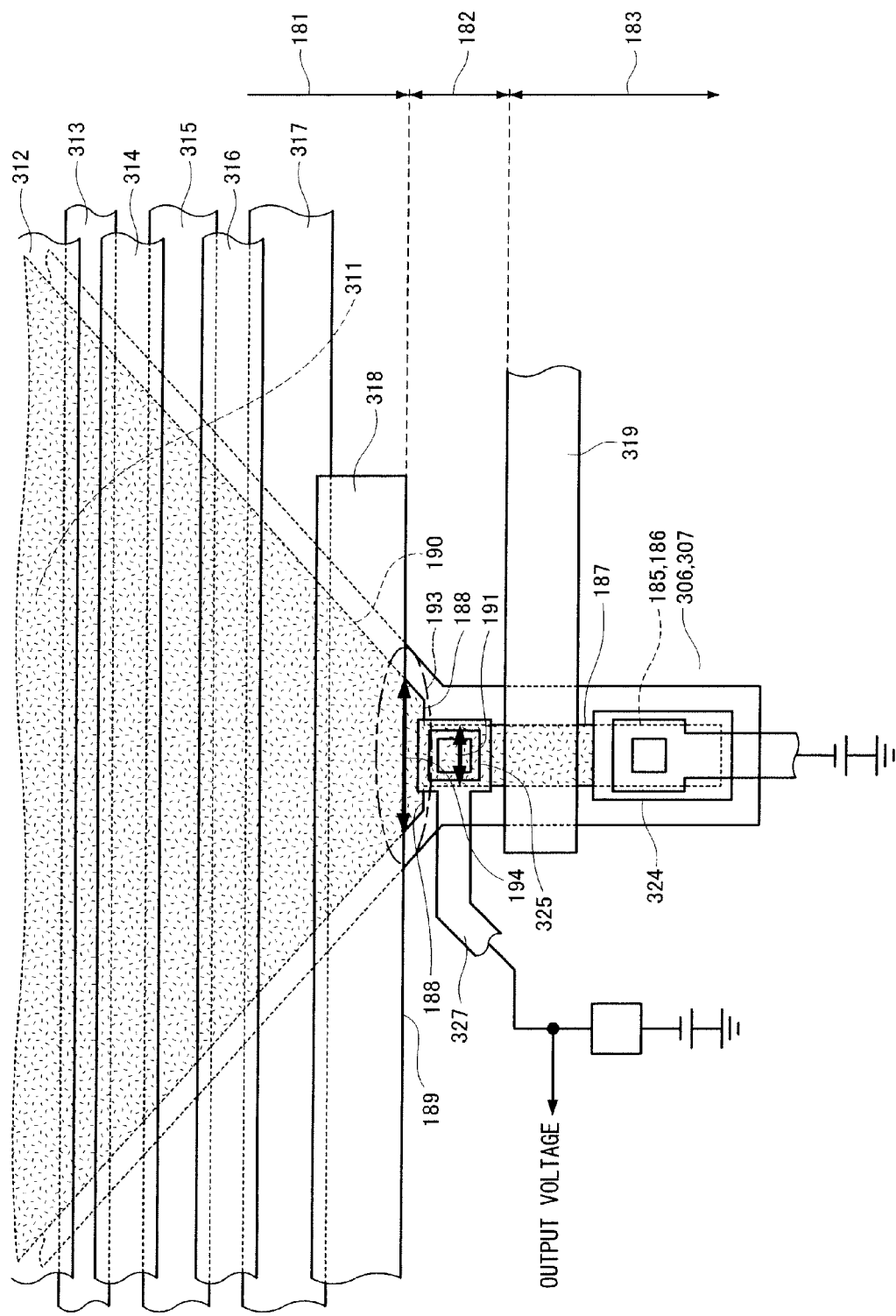
FIG. 15 is a schematic plan view of the horizontal CCD outlet of the solid state image sensor according to Embodiment 6.
Figure 18:
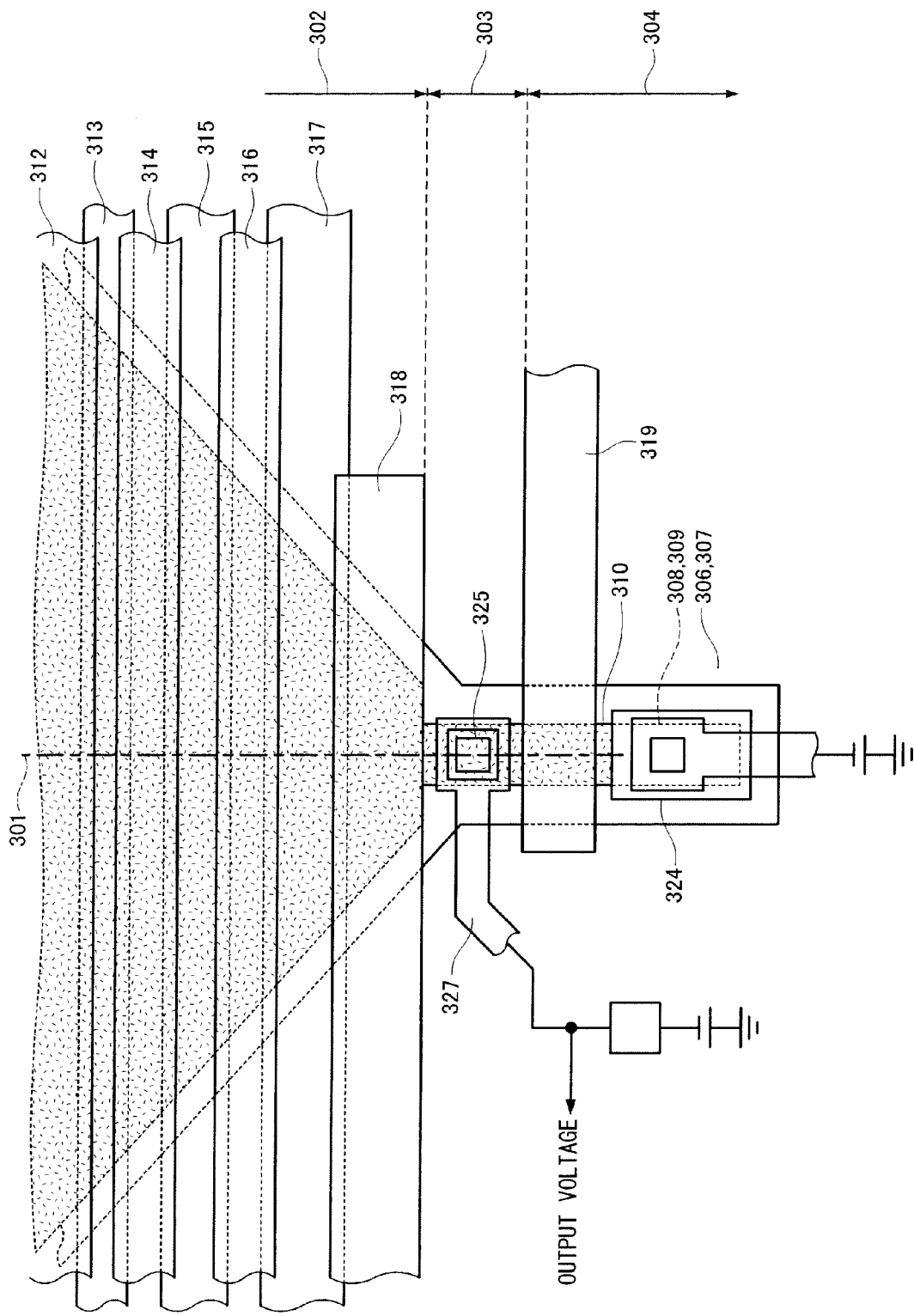
FIG. 18 is a schematic plan view of a horizontal CCD outlet of a solid state image sensor according to a conventional example.
Figure 19:
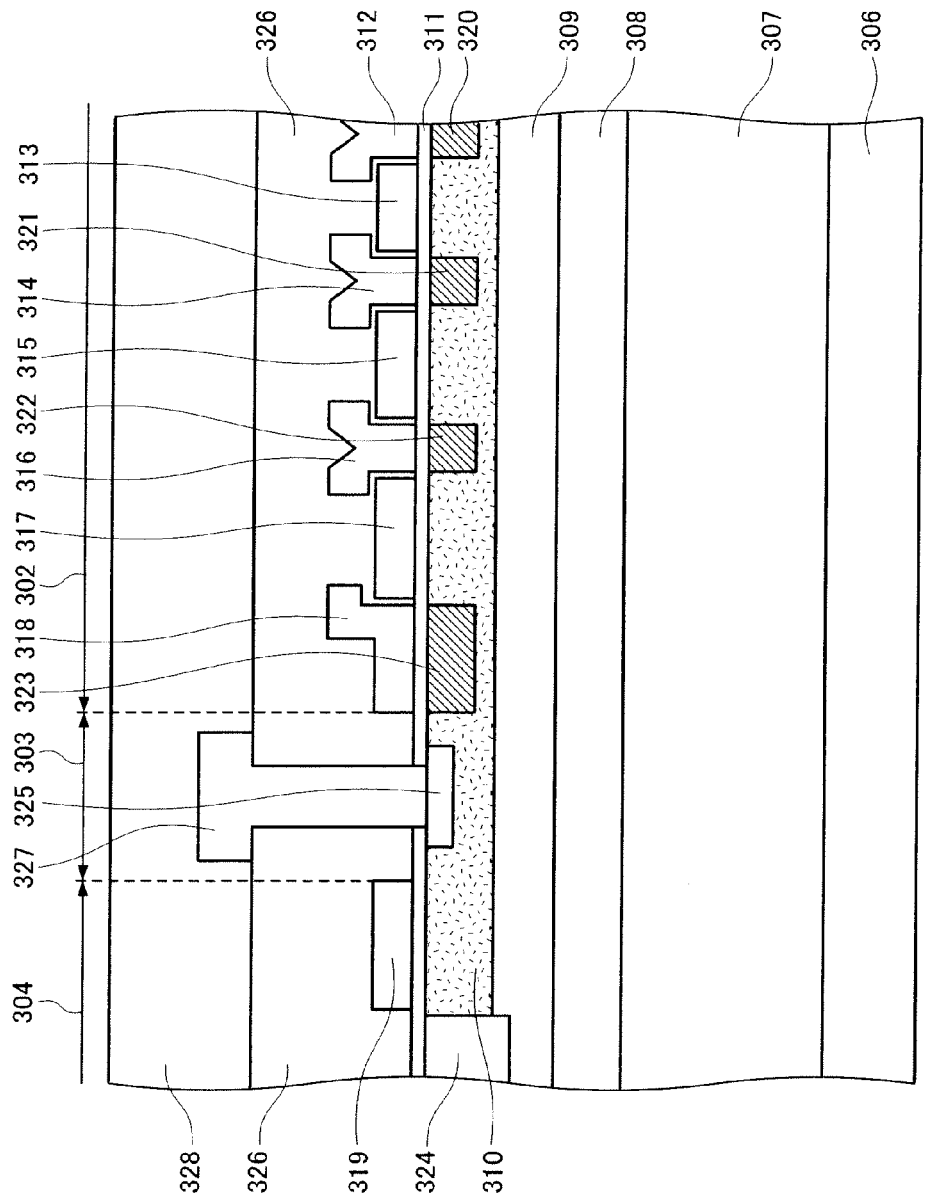
FIG. 19 is a cross-sectional view in a direction parallel to a charge transfer direction according to the conventional example.

FIG. 15 shows a schematic plan view of a horizontal CCD outlet of the solid state image sensor according to Embodiment 6 of the present invention. FIG. 16 is a potential distribution plan view showing a three-dimensional device simulation carried out in a region including the horizontal outlet and a signal electron-voltage conversion section and FIG. 17 shows a relationship between a transfer start position and transfer time according to Embodiment 6. The configuration will be explained using FIG. 15. In this configuration diagram, the same reference numerals as those in FIG. 18 and FIG. 19 indicate identical parts and explanations thereof will be omitted here.

In FIG. 15, a region 181 where a gate electrode 312, a gate electrode 313, a gate electrode 314, a gate electrode 315, a gate electrode 316, a gate electrode 317 and a gate electrode 318 which is an offset gate are formed above an n-type region 187, a p-type region 185 and a p-type region 186 formed on the surface of a substrate 306 through a gate insulating film 311 (see FIG. 19) is the horizontal CCD outlet that sends signal electrons from a horizontal CCD to a voltage conversion section. A region 183 where a gate electrode 319 is formed in contact with the n-type region 187 and an n-type region 324 above the n-type region 187 through the gate insulating film 311 is a reset drain section that discharges signal electrons from the voltage conversion section. A region 182 interposed between the region 181 and region 183 is an FD section for performing signal electron-voltage conversion, made up of the n-type region 187, the p-type region 185, the p-type region 186, a contact 325 and AL wiring 327. A side 188 being the end point of a side 190 narrowed down toward the region 182 being the FD section of the n-type region 187 in the region 181 being the horizontal outlet extends to the region 182 which is the FD section beyond a side 189 of the gate electrode 318 on the region 182 side. In the region 183, the side 188 which is the end point where the n-type region 187 is narrowed down is narrowed down up to a width 191 of the FD section along a line parallel to the side 189. Narrowing down the side 188 along the line parallel to the side 189 can reduce the area of the region 182 which is the FD section, and can thereby reduce the volume of the FD section and maintain the amplifier conversion efficiency which is the size of signal electron-voltage conversion. A chain line section 193 is a region where the narrowed side 190 of the n-type region 187 goes beyond the side 189 of the gate electrode 318 and the side 188 which is the end point of the side 190 is narrowed down to the width 191 of the n-type region in the FD. Forming the side 188 which is the end point of the narrowed side 190 in the n-type region 187 in the region 182 beyond the side 189 makes it possible to increase a width 194 of the frontage of signal transfer from right below the gate electrode 318 in the n-type region 187 to the region 182 which is the FD, thereby improve the signal transfer right below the gate electrode 318 and improve the transfer efficiency in the region 181 which is the horizontal outlet.

In FIG. 15, the n-type region 187 is selectively formed on the surface of the substrate 306. The gate insulating film 311 is formed on the surface of the substrate 306. The gate electrode 318 is formed above the n-type region 187 through the gate insulating film 311. The side 188 which is the end point of the side 190 into which the n-type region 187 is narrowed down is formed extending beyond the side 189 of the gate electrode 318 on the side of the region 182 which is the FD to the signal electron-conversion section. Such a configuration can improve the transfer efficiency at the horizontal outlet.

The mechanism that can improve the transfer efficiency at the horizontal outlet will be explained using FIG. 15, FIG. 16 and FIG. 17. FIG. 16 is a plan view of a potential distribution obtained through a three-dimensional device simulation carried out in the region including the horizontal outlet and the signal electron-voltage conversion section. Since this simulation is symmetric with respect to a signal transmission direction 180 (see FIG. 16), that passes through the center of the horizontal outlet in FIG. 15, as an axis, the simulation is carried out in the region half the region 181 which is the horizontal outlet and region 182 which is the FD section. FIG. 16 shows a potential distribution viewed from above when signal electrons are transferred from right below the gate electrode 317, gate electrode 316 through the gate electrode 318 to the region 182 which is the FD, assuming that the position in a direction along the signal transmission direction 180 that passes through the center of the horizontal outlet is the horizontal axis and the position in a direction perpendicular to the direction 180 is the vertical axis. At the time of transfer, 0.0 V is applied to the gate electrode 317 and gate electrode 316, and 3.3 V is applied to the gate electrode 318. Fine lines are contour lines of the potential distribution and regions densely packed with lines have steep potential variations where signal electrons can be transferred in a short time. On the other hand, regions sparsely packed with contour lines have few potential variations where the transfer deteriorates.

In this simulation structure, the distance on the horizontal axis between the side 189 of the gate electrode 318 on the region 182 side and the side 188 which is the end point is assumed to be 0.25 µm. The transfer of signal electrons from the gate electrode 317 and gate electrode 316 to the region 182 which is the FD is started from a location of an electron 196 placed at an end of the n-type region 187, p-type region 185 and p-type region 186 at a distance of 5.0 µm from the direction 180 viewed from a vertical axis 199, assuming the intersection between the horizontal axis along the direction 180 and the axis 199 in a direction along an end of the gate electrode 317 that adjoins the gate electrode 316 as the origin. The chain line section 193 is a region surrounded by the side 189 of the gate electrode 318 on the region 182 side and the side 188 which is the end point. A dotted line 192 indicates the track of the electron 196 that passes through the valley of the potential distribution contour lines at the time of transfer and is transferred to the region 182 which is the signal electron-voltage conversion section. An arrow 197 indicates the direction of the electron transferred following the potential gradient formed from the gate electrode 317 to the gate electrode 318. A chain line section 195 indicates a region right below the gate electrode 318 where the electron transfer direction is changed from the end of the n-type region 187 to the center of the horizontal outlet due to the potential gradient formed on the boundary with the region 182. An arrow 198 indicates the electron transfer direction in the chain line section 195. The width 194 is the effective width of the transfer channel formed by the potential when the signal electron is transferred from the gate electrode 318 to the region 182.

Figure 17:
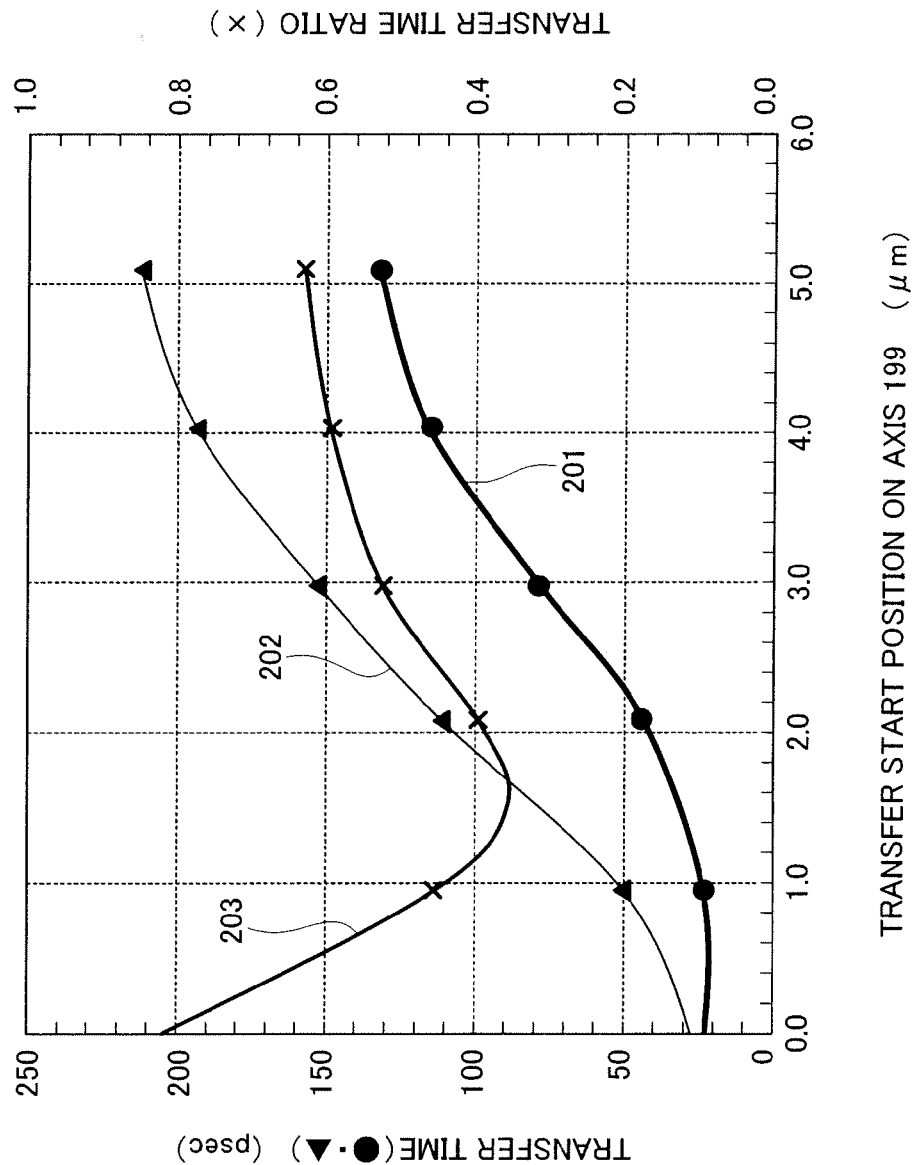
FIG. 17 shows the relationship between a transfer start position and a transfer time according to Embodiment 6.

FIG. 17 shows the transfer time ratio of the transfer time when the transfer of the signal electron is started from the location on the axis 199 in this embodiment with respect to the conventional example which is assumed to be 1. A solid line 201 indicates the transfer time according to this embodiment. A solid line 202 indicates the transfer time in the conventional example. A solid line 203 indicates the transfer time ratio which is the transfer time in this embodiment/transfer time in the conventional example. 0.0 µm on the axis 199 indicates the position in the direction 180 that passes through the center of the horizontal outlet and 5.0 µm indicates the position at the end of the n-type region 187.

Figure 16:
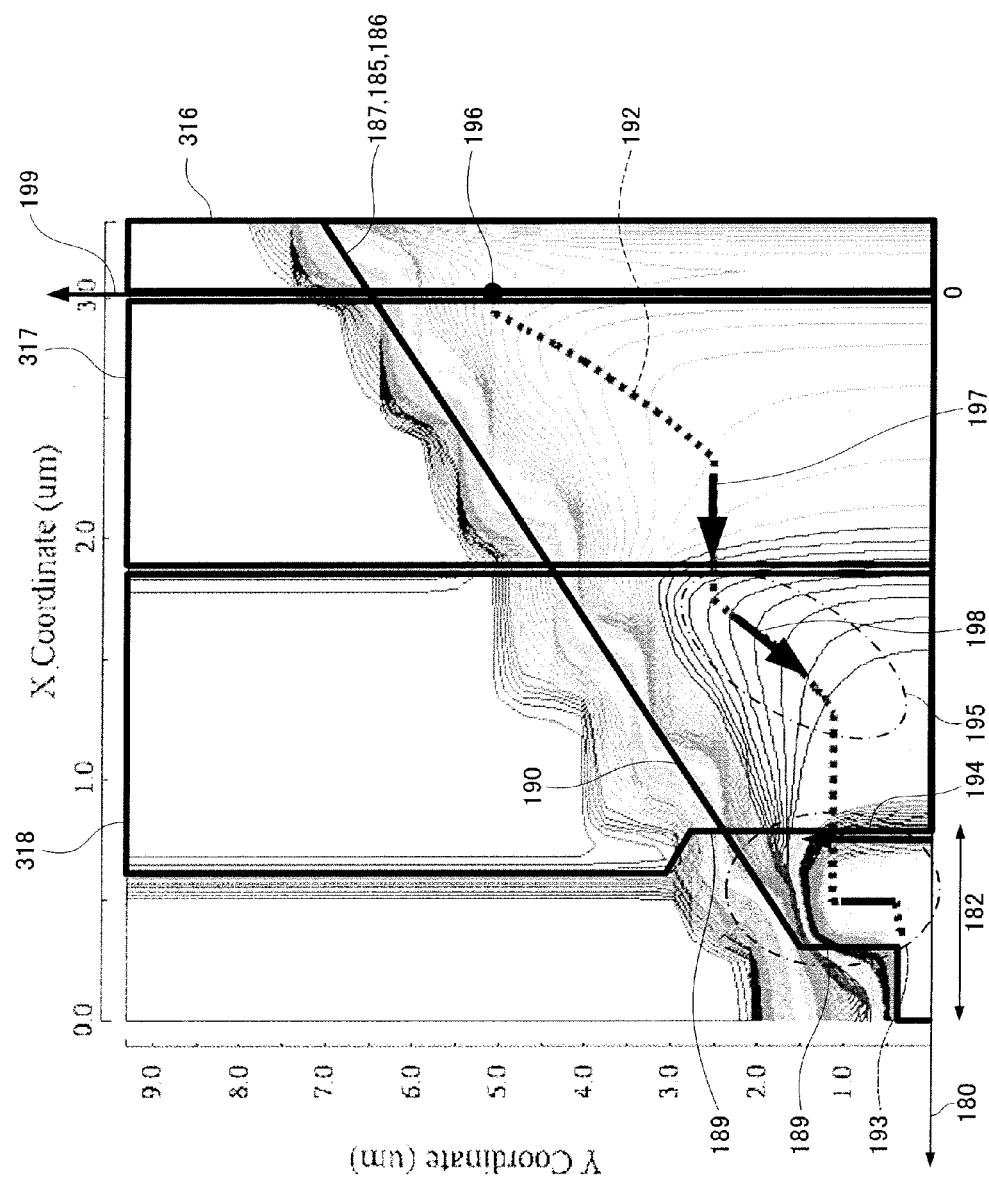
FIG. 16 is a potential distribution plan view when a three-dimensional device simulation is conducted in a region including a horizontal outlet and a signal electron-voltage conversion section.

In FIG. 16, a transfer channel is formed on the dotted line 192 due to a potential distribution when the horizontal CCD is depleted by applying 3.0 V to the gate electrode 317 and gate electrode 316 and a predetermined adjustment voltage=3.3 V to the gate electrode 318. The signal electron 196 gradually moves along the dotted line 192 toward the center of the horizontal outlet. When reaching right below the end of the gate electrode 317 that adjoins the gate electrode 318, the signal electron moves along the arrow 197 to right below the gate electrode 318. Since the side 188 which is the end point of the narrowed side 190 of the n-type region 187 is formed in the region 182 which is the FD section, the potential in the chain line section 193 is the same potential as the supply voltage as with the FD section and can be high. For this reason, the potential gradient can be formed so as to widely overhang from the chain line section 193 to right below the gate electrode 318. This potential gradient forms an electric field directed from the end of the n-type region 187 to the center of the horizontal outlet. For this reason, since the transfer electric field right below the gate electrode 318 is also strengthened, signal electrons transferred to the chain line section 195 right below the gate electrode 318 can be transferred from the gate electrode 318 to the region 182 in a short time with the moving direction changed to the arrow 195. In addition, since the side 188 which is the end point of the narrowed side 190 of the n-type region 187 is formed in the region 182 which is the FD section, the transfer effective channel width 194 can also be increased, and the transfer from the gate electrode 318 to the region 182 can further be enhanced.

In FIG. 17, with regard to the transfer time from the position on the axis 199 to the region 182, the solid line 201 in this embodiment shows that the electron can be transferred from around a position past the position=1.0 µm on the axis 199 in a shorter time than the conventional example. With the enhancement of the potential gradient right below the gate electrode 318 and the expansion of the transfer effective channel width 194, the solid line 203 indicating the transfer time ratio shows that at a position 5.0 µm or more from the position=0.0 µm on the axis 199, the transfer time has drastically been improved within a range of 0.40 to 0.80 compared to the conventional example. This indicates that this embodiment can considerably improve the transfer of signal electrons from the gate electrode 316 and gate electrode 317 at the horizontal outlet to the region 182 which is the FD section in any place in the horizontal CCD.

The side 188 which is the end point of the narrowed side 190 of the n-type region 187 is formed in the region 182, but using the design of minimizing the distance between the side 188 and side 189 in the transfer direction 180 and the process capable of reducing the contact 325 in FIG. 15, for example, a tungsten plug formation process can reduce the area of the n-type region 187 in the region 182, and can thereby maintain the amplifier conversion efficiency at a high level.

As shown above, according to this embodiment, the n-type diffusion layer selectively formed on the surface of the semiconductor substrate, the insulating film formed on the n-type diffusion layer on the surface of the semiconductor, the gate electrode formed above the n-type diffusion layer through the insulating film and the end point on the narrowed side of the n-type diffusion layer at the outlet of the horizontal CCD extend to the signal electron-voltage conversion section beyond the gate electrode, and it is thereby possible to manufacture a solid state image sensor capable of improving the transfer efficiency at the horizontal outlet.

The embodiments have explained the case where the solid state image sensor is formed on the n-type semiconductor substrate, but by reversing the conductive types of the respective components, it is also possible to form a solid state image sensor on a p-type semiconductor substrate.

What is claimed is:

1. A solid-state image sensor comprising:
an N-type semiconductor substrate;
a P-type well formed in the N-type semiconductor substrate;
an N-type horizontal transfer region formed in the P-type well;
a gate insulating film formed on a surface of the N-type semiconductor substrate;
a first storage gate electrode formed on a horizontal transfer outlet of the N-type horizontal transfer region via the gate insulating film;
a first offset gate electrode formed on the horizontal transfer outlet via the gate insulating film which is next to the first storage gate electrode;

a first P-type region in the N-type horizontal transfer region under the first offset gate electrode; and a first N-type region formed in the horizontal transfer region directly under the first offset gate electrode and the first storage gate electrode, wherein a concentration of an N-type impurity of the first N-type region is lower than a concentration of an N-type impurity of the N-type horizontal transfer region, wherein a bottom of the first N-type region is lower than a bottom of the N-type horizontal transfer region.

2. The solid-state image sensor according to claim 1, further comprising:

a second offset gate electrode formed on the N-type horizontal transfer region next to the first storage gate electrode on the other side opposite to the first offset gate electrode, wherein the first N-type region extends under the second offset gate electrode.

3. The solid-state image sensor according to claim 2, further comprising:

a second storage gate electrode formed on the N-type horizontal transfer region next to the second offset gate electrode on the other side opposite to the first storage gate electrode, wherein the first N-type region extends under the second storage gate electrode.

4. The solid-state image sensor according to claim 3, wherein a gate length of the second storage gate electrode is shorter than a gate length of the first storage gate electrode.

5. The solid-state image sensor according to claim 1, wherein a width of the N-type horizontal transfer region under the first storage gate electrode is larger than a width of the N-type horizontal transfer region under the first offset gate electrode.

* * * * *